(12) United States Patent
Watanabe

(10) Patent No.: US 11,855,601 B2
(45) Date of Patent: Dec. 26, 2023

(54) HIGH-FREQUENCY SEMICONDUCTOR DEVICE

(71) Applicant: Mitsubishi Electric Corporation, Tokyo (JP)

(72) Inventor: Shinsuke Watanabe, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 161 days.

(21) Appl. No.: 17/597,734

(22) PCT Filed: Jan. 7, 2020

(86) PCT No.: PCT/JP2020/000163
§ 371 (c)(1),
(2) Date: Jan. 20, 2022

(87) PCT Pub. No.: WO2021/140563
PCT Pub. Date: Jul. 15, 2021

(65) Prior Publication Data
US 2022/0263497 A1    Aug. 18, 2022

(51) Int. Cl.
*H03H 11/28*    (2006.01)
*H01L 23/66*    (2006.01)

(52) U.S. Cl.
CPC ............. *H03H 11/28* (2013.01); *H01L 23/66* (2013.01); *H01L 2223/6655* (2013.01)

(58) Field of Classification Search
CPC ....................................................... H03H 11/28
USPC ......................................................... 327/551
See application file for complete search history.

(56) References Cited

U.S. PATENT DOCUMENTS

| 2007/0024371 | A1 | 2/2007 | Gotou et al. |
| 2008/0094141 | A1* | 4/2008 | Gotou ............... H03F 3/604 330/295 |

FOREIGN PATENT DOCUMENTS

| JP | 2006-025405 A | 1/2006 |
| JP | 2007-060616 A | 3/2007 |
| JP | 2008-109227 A | 5/2008 |

(Continued)

OTHER PUBLICATIONS

International Search Report issued in PCT/JP2020/000163; dated Mar. 17, 2020.

(Continued)

*Primary Examiner* — Tomi Skibinski
(74) *Attorney, Agent, or Firm* — Studebaker & Brackett PC

(57) ABSTRACT

The present invention relates to a high-frequency semiconductor device. A conventional high-frequency semiconductor device including an input second-order harmonic matching circuit has such a problem that gain decrease occurs. In a high-frequency semiconductor device (100) of the present invention, two adjacent unit transistor cells (7) and (8) are connected to one input second-order harmonic matching circuit (19) provided on an upper surface of a semiconductor substrate (1). The input second-order harmonic matching circuit (19) includes a first capacitor (13), a first inductor (14), a second capacitor (15), and a second inductor (16). The first capacitor (13) and the first inductor (14) resonate at the frequency of a fundamental wave, and each of impedances as seen by input electrodes of the two unit transistor cells (7) and (8) is short-circuited at the frequency of a second-order harmonic.

11 Claims, 25 Drawing Sheets

(56) References Cited

FOREIGN PATENT DOCUMENTS

JP 4743077 B2 8/2011

OTHER PUBLICATIONS

Shinichi Miwa et al. "A 67% PAE, 100 W GaN Power Amplifier with On-Chip Harmonic Tuning Circuits for C-band Space Applications" 2011 IEEE MTT-S International Microwave Symposium, Jun. 2011.

* cited by examiner

HIGH-FREQUENCY SEMICONDUCTOR DEVICE

FIELD

The present disclosure relates to a high-frequency semiconductor device including a harmonic processing circuit.

BACKGROUND

Gain and power added efficiency are indicators of the performance of a high-frequency semiconductor device configured to perform power amplification at high frequency.

When a high-frequency semiconductor device of high gain is used, desired output power can be obtained with small input power, and thus the configuration of a communication system or a radar system using the high-frequency semiconductor device can be simplified to achieve cost reduction.

When a high-frequency semiconductor device of high power added efficiency is used, the amount of heat generation from an amplifier using the high-frequency semiconductor device can be reduced, and thus a cooling mechanism used in the communication system or the radar system can be simplified to achieve cost reduction.

In a method of improving the power added efficiency of a high-frequency semiconductor device, high efficiency operation is achieved by controlling impedance of a peripheral circuit as seen by a semiconductor at a frequency (hereinafter, referred to as a harmonic) equal to an integer multiple of the frequency of a signal (hereinafter, referred to as a fundamental wave) to be amplified by the semiconductor.

It is known that the power added efficiency increases by short-circuiting the input load on the input side as seen by a control terminal of a high-frequency semiconductor at a frequency (hereinafter, referred to as a second-order harmonic) twice the frequency of the fundamental wave, in particular.

For example, PTL 1 discloses a high-frequency semiconductor amplifier which is a high-frequency power amplifier including a transistor element in which a plurality of unit transistors each formed of a plurality of multi-finger transistors connected in parallel are provided on a semiconductor substrate, a control terminal of each unit transistor being shunted with a series resonance circuit, the series resonance circuit being set to resonate at a desired frequency of a second-order or a higher-order harmonic of an operation frequency.

NPL 1 discloses a high-frequency semiconductor amplifier in which a second-order harmonic resonance circuit made of a metal insulator metal (MIM) capacitor and a spiral inductor is produced on a semiconductor substrate same as that of unit transistors and connected to a control terminal of each unit transistor, thereby highly accurately controlling impedance for the second-order harmonic to achieve high efficiency and high output.

CITATION LIST

Patent Literature

[PTL 1] JP 2008-109227 A

Non Patent Literature

[NPL 1] 2011 IEEE MTT-S International Microwave Symposium, "A 67% PAE, 100 W GaN Power Amplifier with On-Chip Harmonic Tuning Circuits for C-band Space Applications"

SUMMARY

Technical Problem

In the high-frequency semiconductor amplifiers disclosed in PTL 1 and NPL 1, an input second-order harmonic matching circuit monolithically formed on the upper surface of a substrate of a high-frequency semiconductor is directly connected to a gate pad. Thus, an input second-order harmonic load can be ideally short-circuited without influence of the resistance component and inductance of a bonding wire unlike a case in which the input second-order harmonic matching circuit is provided outside the semiconductor substrate and connected to the gate pad through the bonding wire.

However, the load of the input second-order harmonic matching circuit disclosed in PTL 1 and NPL 1 is not opened but is capacitive for the fundamental wave. Accordingly, a characteristic change such as increase of gate-source parasitic capacitance of the high-frequency semiconductor occurs and causes gain decrease, which has been a problem.

The present disclosure is made to solve the above-described problem and intended to provide a high-frequency semiconductor device including a harmonic processing circuit, which can achieve both high power added efficiency and high gain.

Solution to Problem

A high-frequency semiconductor device according to the present disclosure includes a semiconductor substrate, a first unit transistor cell and a second unit transistor cell provided adjacent to each other on an upper surface of the semiconductor substrate, each unit transistor cell including a plurality of multi-finger transistors having input electrodes connected in parallel and output electrodes connected in parallel, a first capacitor provided on the upper surface of the semiconductor substrate and having one end connected to an input electrode of the first unit transistor cell, a first inductor provided on the upper surface of the semiconductor substrate and having one end connected to an input electrode of the second unit transistor cell, a second capacitor provided on the upper surface of the semiconductor substrate and having one end connected to another end of the first capacitor and another end of the first inductor and a second inductor provided on the upper surface of the semiconductor substrate, having one end connected to another end of the second capacitor, and having another end connected to a ground terminal. The first capacitor and the first inductor resonate at a frequency of a fundamental wave, and each of impedance on the first capacitor side as seen by the input electrode of the first unit transistor cell and impedance on the first inductor side as seen by the input electrode of the second unit transistor cell is short-circuited at a frequency of a second-order harmonic.

Advantageous Effects of Invention

In a high-frequency semiconductor device according to the present disclosure, each of impedance on a first capacitor side as seen by an input electrode of a first unit transistor cell and impedance on a first inductor side as seen by an input electrode of a second unit transistor cell is opened for fundamental wave and short-circuited for a second-order harmonic. Thus, it is possible to achieve both high power added efficiency and high gain.

DESCRIPTION OF EMBODIMENTS

First Embodiment

Figure 1:
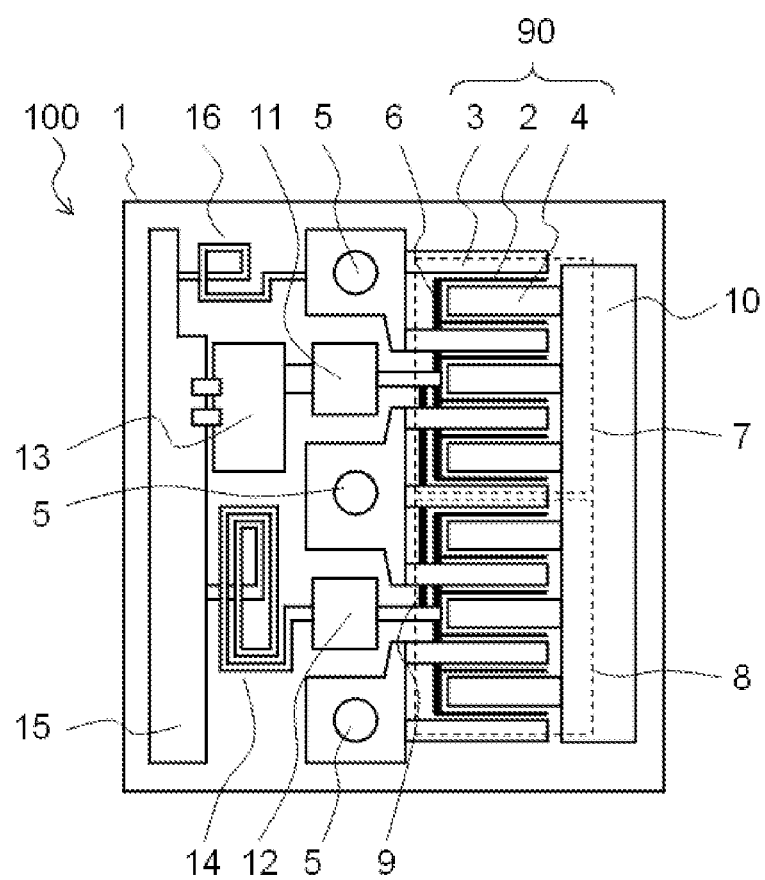
FIG. 1 is a plan view of a high-frequency semiconductor device 100 according to the first embodiment.

A high-frequency semiconductor device according to the first embodiment will be described below with reference to the accompanying drawings.

Note that components denoted by the same reference sign in the drawings are identical or equivalent to each other, which applies in the entire specification. The drawings are schematically illustrated, and components are omitted or simplified as appropriate for convenience of description. The mutual relation between the sizes and positions of components or the like illustrated in different drawings is not necessarily accurately illustrated but may be changed as appropriate.

FIG. 1 is a plan view of a high-frequency semiconductor device 100 according to the first embodiment.

In FIG. 1, a semiconductor substrate 1 is a semiconductor substrate included in the high-frequency semiconductor device 100. The material of the semiconductor substrate 1 is, for example, silicon, silicon carbide, gallium arsenide, or gallium nitride. In a case of a silicon substrate, a high resistance substrate having a small dielectric tangent is desirable.

A multi-finger transistor is provided on the upper surface of the semiconductor substrate 1. The multi-finger transistor may be a FET including a metal-semiconductor field effect transistor (MESFET), a high electron mobility transistor (HEMT), a metal-oxide-semiconductor field effect transistor (MOS FET), or the like. Alternatively, the multi-finger transistor may be a heterojunction bipolar transistor (HBT). Description of the first embodiment will be made with an example in which the multi-finger transistor is an FET.

A plurality of gate electrodes, source electrodes, and drain electrodes included in the multi-finger transistor are alternately provided in parallel in comb shapes on the upper surface of the semiconductor substrate 1. For example, a gate electrode 2, and a source electrode 3 and a drain electrode 4 adjacent to the gate electrode 2 form a transistor 90 corresponding to one finger. The gate electrode is an input electrode to which a signal is input, and the drain electrode is an output electrode from which a signal is output.

Each set of another gate electrode and a source electrode and a drain electrode adjacent to the gate electrode form a transistor corresponding to one finger. Accordingly, a plurality of multi-finger transistors are provided on the upper surface of the semiconductor substrate 1.

A metal film (not illustrated) as a ground terminal of the high-frequency semiconductor device 100 is formed on the substantially entire lower surface of the semiconductor substrate 1. The source electrode 3 is connected to a via hole 5. The via hole 5 penetrates through the semiconductor substrate 1 to provide conduction between the upper surface of the semiconductor substrate 1 and the ground terminal of the lower surface.

The gate electrodes of a predetermined number of transistors each corresponding to one finger are connected in parallel through a gate feeder 6. The gate feeder 6 is also called a gate bus bar. The gate feeder 6 is a metal signal wire.

Hereinafter, in the present specification, a set of transistors connected in parallel through the gate feeder 6 is referred to as a unit transistor cell. As illustrated in FIG. 1, unit transistor cells 7 and 8 each include gate electrodes corresponding to six fingers and connected in parallel. Drain electrodes of the unit transistor cells 7 and 8 are connected in parallel through an output bonding pad 10.

The unit transistor cells 7 and 8 are provided adjacent to each other. The unit transistor cell 7 is a first unit transistor cell, and the unit transistor cell 8 is a second unit transistor cell. Gate electrodes of the unit transistor cells 7 and 8 are connected in parallel through a gate feeder 9. The gate feeder 9 is a metal signal wire and can have a certain resistance value by adjusting the thickness and material of the wire. Oscillation can be prevented by connecting the gates of the unit transistor cells through the gate feeder 9 as a resistor.

The gate electrode of the unit transistor cell 7 is connected to a bonding pad 11 provided on the upper surface of the semiconductor substrate 1 through a lead-out wire. The bonding pad 11 is a first bonding pad.

The gate electrode of the unit transistor cell 8 is connected to a bonding pad 12 provided on the upper surface of the semiconductor substrate 1 through a lead-out wire. The bonding pad 12 is a second bonding pad.

A capacitor 13 is a first capacitor. The capacitor 13 is a metal-insulator-metal (MIM) capacitor provided on the upper surface of the semiconductor substrate 1. The capacitor 13 has one end connected to the bonding pad 11 through a lead-out wire.

An inductor 14 is a first inductor. The inductor 14 is a spiral inductor provided on the upper surface of the semiconductor substrate 1 and made of a transmission line. The inductor 14 has one end connected to the bonding pad 12.

A capacitor 15 is a second capacitor. The capacitor 15 is an MIM capacitor provided on the upper surface of the semiconductor substrate 1. The capacitor 15 has one end connected to the other end of the capacitor 13 and the other end of the inductor 14.

An inductor 16 is a second inductor. The inductor 16 is a spiral inductor provided on the upper surface of the semiconductor substrate 1 and made of a transmission line. The inductor 16 has one end connected to the other end of the capacitor 15 and has the other end connected to the via hole 5.

Figure 2:
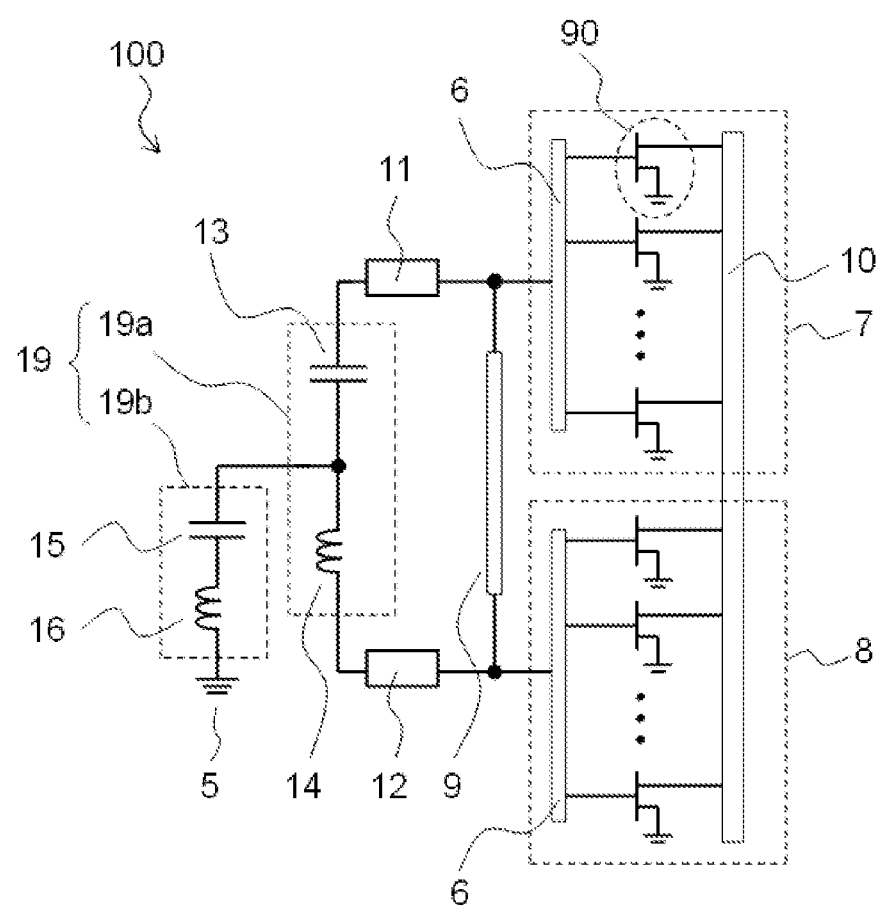
FIG. 2 is an equivalent circuit diagram of the high-frequency semiconductor device 100 according to the first embodiment.

FIG. 2 is an equivalent circuit diagram of the high-frequency semiconductor device 100 according to the first embodiment.

As illustrated in FIG. 2, the high-frequency semiconductor device 100 includes an input second-order harmonic matching circuit 19 that is a harmonic processing circuit. The capacitor 13 and the inductor 14 form a fundamental wave resonance circuit 19a configured to resonate at the frequency of a fundamental wave. The capacitor 15 and the inductor 16 form a second-order harmonic resonance circuit 19b configured to resonate at a frequency beyond the frequency of the fundamental wave and lower than the frequency of a second-order harmonic. The fundamental wave resonance circuit 19a and the second-order harmonic resonance circuit 19b form the input second-order harmonic matching circuit 19.

In the first embodiment, the inductor 14 and the inductor 16 are spiral inductors but not limited to spiral inductors and may be transmission lines, meander lines, or the like when desired inductance can be obtained.

Figure 3:
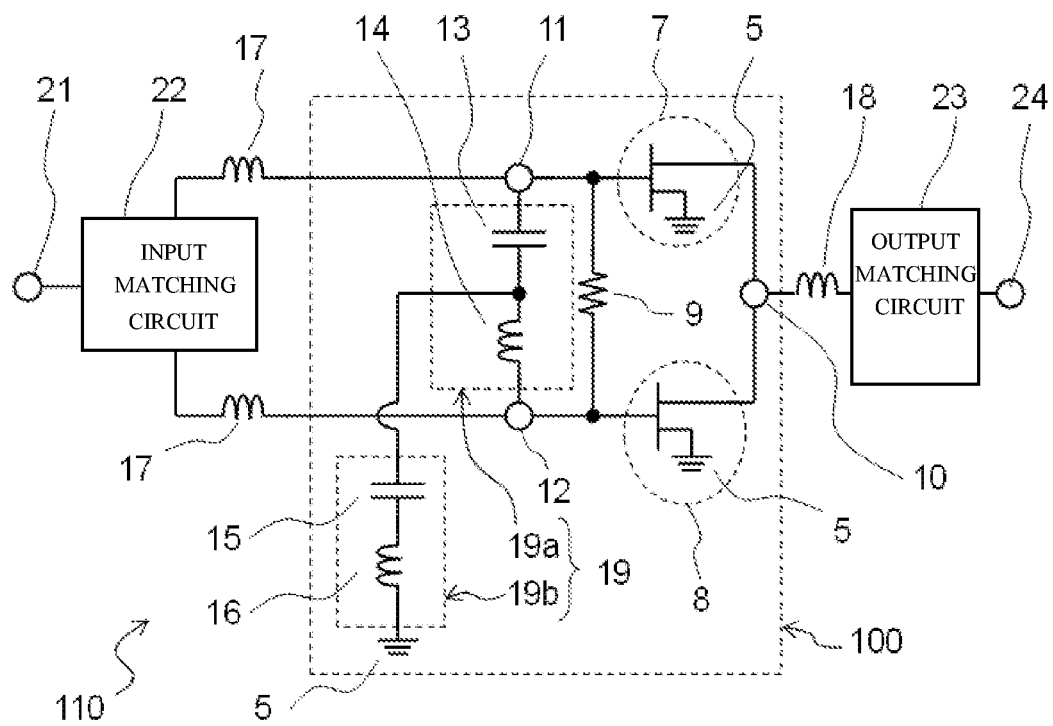
FIG. 3 is an equivalent circuit diagram of a high-frequency semiconductor device 110 according to the first embodiment.

FIG. 3 is an equivalent circuit diagram of a high-frequency semiconductor device 110 according to the first embodiment. Note that parts, such as a housing and a bias circuit, which are not important for description of the present disclosure are omitted in FIG. 3.

An input matching circuit 22 includes an input terminal 21. The input terminal 21 is an input terminal to which a signal is input from the outside. The input matching circuit 22 is connected to the bonding pad 11 and the bonding pad 12 of the high-frequency semiconductor device 100 through bonding wires 17.

The output bonding pad 10 of the high-frequency semiconductor device 100 is connected to an output matching circuit 23 through a bonding wire 18. The output matching circuit 23 includes an output terminal 24. A signal input from the input terminal 21 and amplified by the high-frequency semiconductor device 110 is output from the output terminal 24.

The input matching circuit 22 and the output matching circuit 23 may be each a plane circuit formed of a distributed parameter element on a thin plate of a dielectric such as a ceramic or a printed substrate, may be each a circuit formed of a lumped parameter element such as a chip capacitor or a chip inductor, or may be each configured as a mixture circuit thereof.

When the high-frequency semiconductor device 100 is used, its lower surface is fixed and conducted to a housing of the high-frequency semiconductor device 110 through a joining material such as solder or a conductive bonding agent. The housing of the high-frequency semiconductor device 110 provides ground potential, and accordingly, the source electrode 3 is grounded.

The housing of the high-frequency semiconductor device 110 may be an air-tightness package, a resin molding package, or the like including a frame body made of, for example, ceramic, and the high-frequency semiconductor device 100, the input matching circuit 22, and the output matching circuit 23 may be housed in the housing. Alternatively, the high-frequency semiconductor device 110 may have a module format in which the high-frequency semiconductor device 100 and lumped parameter elements are provided on a printed substrate and covered by overmolding. In addition, a bias circuit, control and power source semiconductors, and the like may be housed.

Note that the high-frequency semiconductor device 110 may be configured as a monolithic microwave integrated circuit (MMIC).

In this case, the input matching circuit 22 and the output matching circuit 23 are monolithically formed on the upper surface of the semiconductor substrate 1 of the high-frequency semiconductor device 100. The bonding pads 11 and 12 and the output bonding pad 10 do not necessarily need to be formed. The input matching circuit 22 may be connected to input electrodes of the unit transistor cells 7 and 8 not through the bonding wires 17 and the bonding pads 11 and 12 but through wires provided on the semiconductor substrate 1. The output matching circuit 23 may be connected to output electrodes of the unit transistor cells 7 and 8 not through the bonding wire 18 and the output bonding pad 10 but through wires provided on the semiconductor substrate 1.

Subsequently, operations of the high-frequency semiconductor devices according to the first and second comparative examples and the first embodiment will be discussed below to facilitate understanding of significance of the high-frequency semiconductor device according to the first embodiment.

The configurations of the first and second comparative examples will be described first, and then calculation results of the high-frequency semiconductor devices according to the first and second comparative examples are presented to clarify problems of the conventional high-frequency semiconductor devices.

Note that, the bonding pads 11 and 12 in the first embodiment and a bonding pad 81 in the first and second comparative examples have different reference signs for identification, but specifications thereof have no difference.

Figure 4:
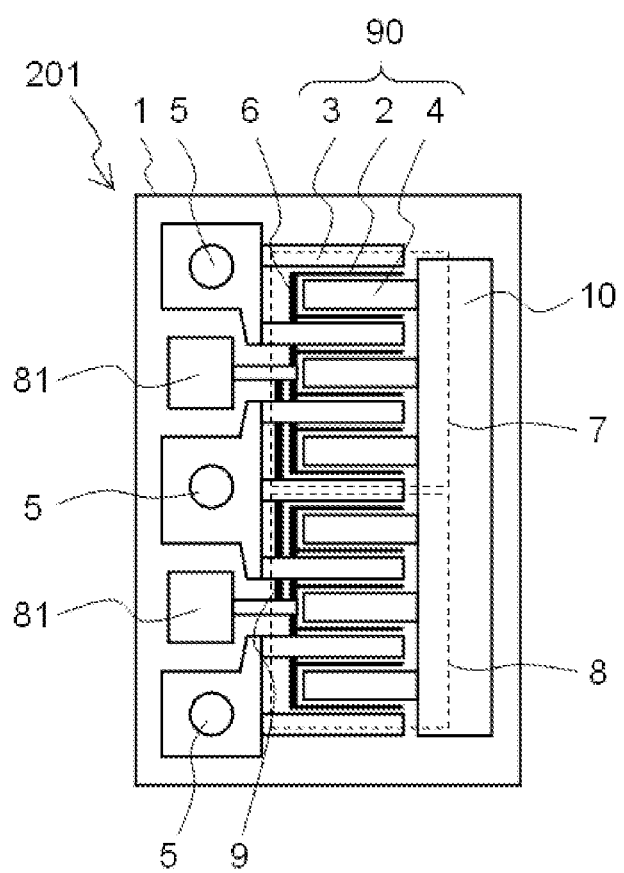
FIG. 4 is a plan view of a high-frequency semiconductor device 201 according to the first comparative example.

FIG. 4 is a plan view of a high-frequency semiconductor device 201 according to the first comparative example.

The high-frequency semiconductor device 201 is a high-frequency semiconductor device including no harmonic processing circuit. The high-frequency semiconductor device 201 of the first comparative example includes neither the capacitor 13, the inductor 14, the capacitor 15, nor the inductor 16, which is difference from the high-frequency semiconductor device 100. The other configurations are same.

Figure 5:
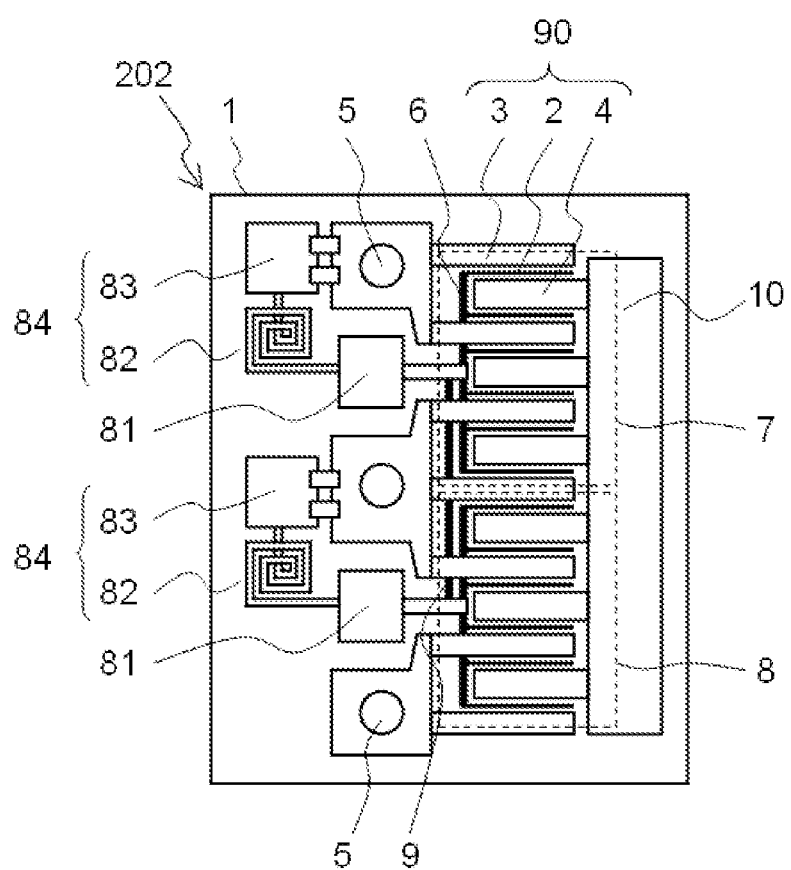
FIG. 5 is a plan view of a high-frequency semiconductor device 202 according to the second comparative example.

FIG. 5 is a plan view of a high-frequency semiconductor device 202 according to the second comparative example.

The high-frequency semiconductor device 202 of the second comparative example has a configuration based on that of a high-frequency semiconductor amplifier disclosed in NPL 1 and is a high-frequency semiconductor amplifier including a conventional harmonic processing circuit. The high-frequency semiconductor device 202 of the second comparative example includes neither the capacitor 13, the inductor 14, the capacitor 15, nor the inductor 16 but includes an inductor 82 and a capacitor 83, which is difference from the high-frequency semiconductor device 100. The other configurations are same.

The inductor 82 has one end connected to the bonding pad 81 and has the other end connected to one end of the capacitor 83. The other end of the capacitor 83 is connected to the via hole 5. The inductor 82 and the capacitor 83 form an input second-order harmonic matching circuit 84. The input second-order harmonic matching circuit 84 is a resonance circuit configured to resonate for the second-order harmonic and is a harmonic processing circuit in which impedance on the bonding pad side as seen by the gate electrode of the unit transistor cell 7 or 8 is short-circuited for the second-order harmonic.

Figure 6:
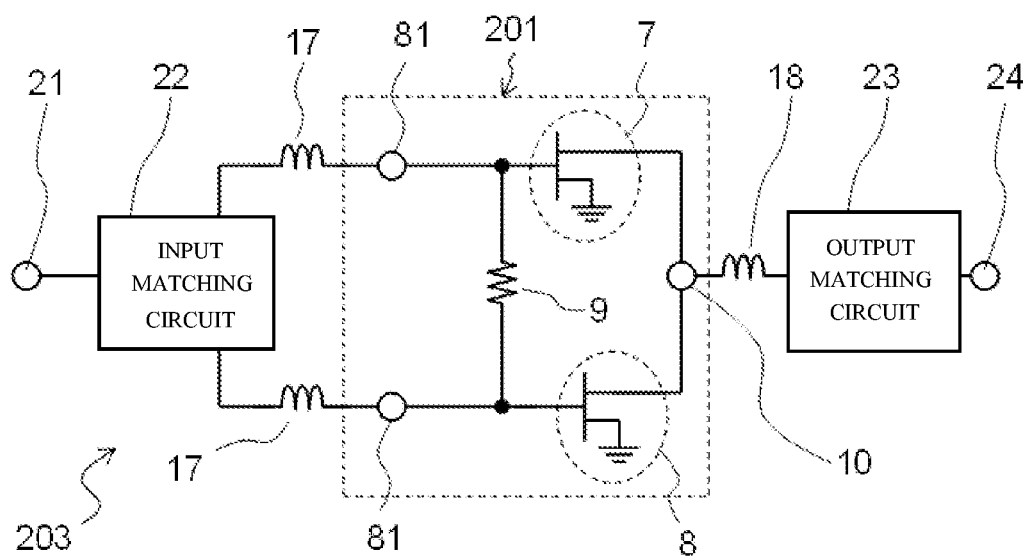
FIG. 6 is an equivalent circuit diagram of a high-frequency semiconductor device 203 according to the first comparative example.

FIG. 6 is an equivalent circuit diagram of a high-frequency semiconductor device 203 according to the first comparative example.

In the high-frequency semiconductor device 203, a signal is input from the input terminal 21 to the input matching circuit 22. The input matching circuit 22 is connected to the bonding pad 81 through the bonding wires 17. The output bonding pad 10 is connected to the output matching circuit 23 through the bonding wire 18, and the output matching circuit 23 is connected to the output terminal 24.

Figure 7:
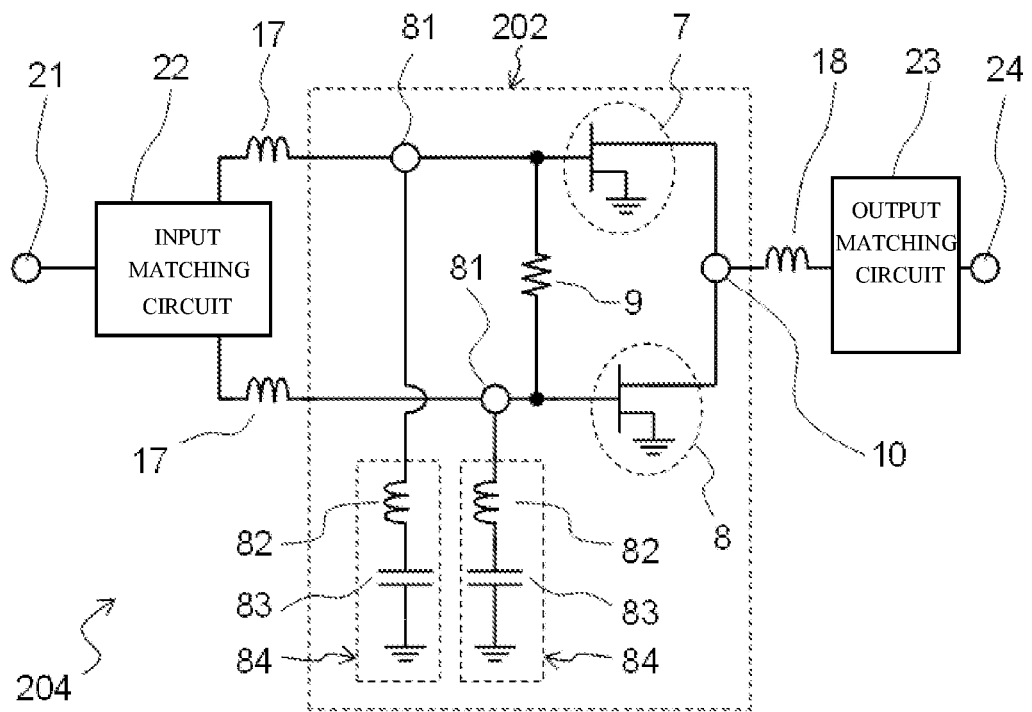
FIG. 7 is an equivalent circuit diagram of a high-frequency semiconductor device 204 according to the second comparative example.

FIG. 7 is an equivalent circuit diagram of a high-frequency semiconductor device 204 according to the second comparative example.

In the high-frequency semiconductor device 204, a signal is input from the input terminal 21 to the input matching circuit 22. The input matching circuit 22 is connected to the bonding pad 81 through the bonding wires 17. The output bonding pad 10 is connected to the output matching circuit 23 through the bonding wire 18, and the output matching circuit 23 is connected to the output terminal 24.

In each of the high-frequency semiconductor device 203 and the high-frequency semiconductor device 204, the input matching circuit 22 and the output matching circuit 23 are optimized.

Subsequently, calculation results of performance of the high-frequency semiconductor devices according to the first and second comparative examples are presented.

Figure 8:
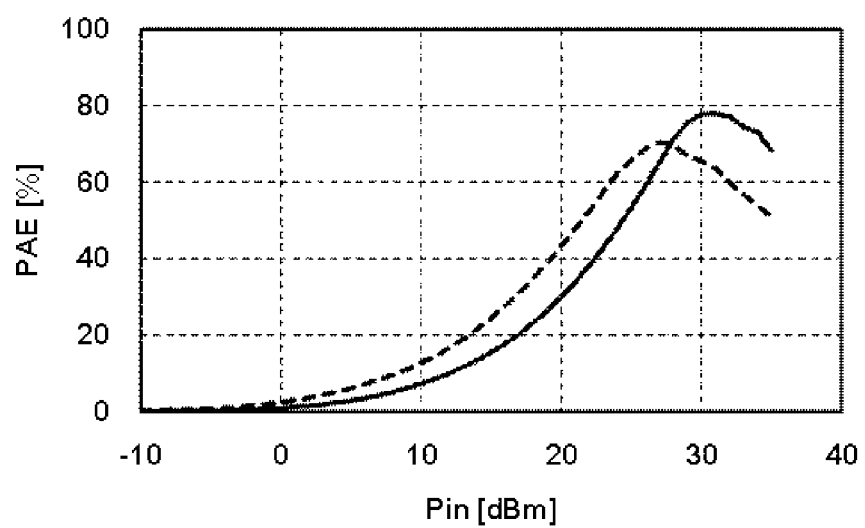
FIG. 8 is a diagram illustrating calculation results of the power added efficiency of the high-frequency semiconductor devices according to the first and second comparative examples.

FIG. 8 is a diagram illustrating calculation results of the power added efficiency of the high-frequency semiconductor devices according to the first and second comparative examples. In FIG. 8, the horizontal axis represents input power, and the vertical axis represents the power added efficiency. The frequency of a fundamental wave input to the high-frequency semiconductor devices was 2.7 GHz. In FIG. 8, a dotted line represents a calculation result of the high-frequency semiconductor device 203 of the first comparative example, and a solid line represents a calculation result of the high-frequency semiconductor device 204 of the second comparative example.

The power added efficiency of the high-frequency semiconductor device 203 was approximately 70% at maximum. However, the maximum value of the power added efficiency of the high-frequency semiconductor device 204 was approximately 80%. Thus, the maximum value of the power added efficiency of the high-frequency semiconductor device 204 was approximately 10% higher than that of the high-frequency semiconductor device 203.

Figure 9:
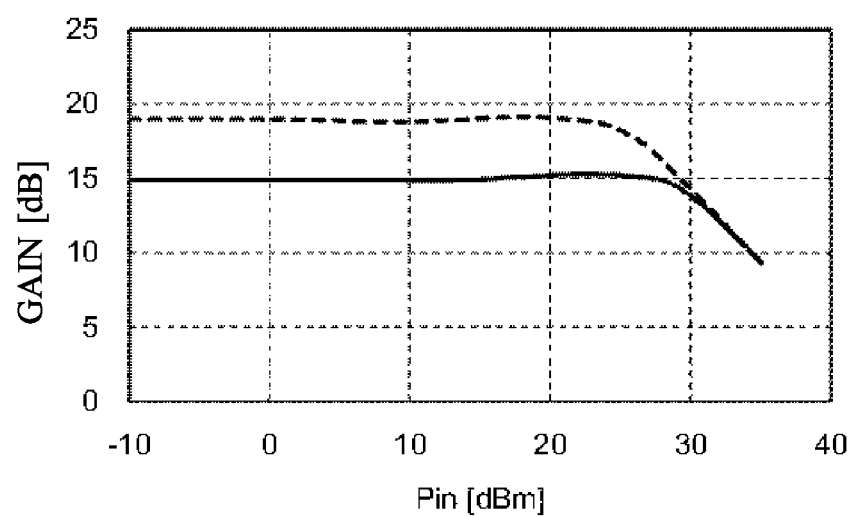
FIG. 9 is a diagram illustrating calculation results of the gain of the high-frequency semiconductor devices according to the first and second comparative examples.

FIG. 9 is a diagram illustrating calculation results of the gain of the high-frequency semiconductor devices according to the first and second comparative examples. In FIG. 9, the horizontal axis represents input power, and the vertical axis represents the gain. Similarly to FIG. 8, the frequency of a fundamental wave input to the high-frequency semiconductor devices was 2.7 GHz. A dotted line represents a calculation result of the high-frequency semiconductor device 203 of the first comparative example, and a solid line represents a calculation result of the high-frequency semiconductor device 204 of the second comparative example.

As illustrated FIG. 9, the gain of the high-frequency semiconductor device 203 is approximately 19 dB in a range in which the input power is equal to or smaller than 20 dBm. However, the gain of the high-frequency semiconductor device 204 is approximately 15 dB. Thus, the gain of the high-frequency semiconductor device 204 was approximately 4 dB lower than that of the high-frequency semiconductor device 203.

The above-described gain decrease occurs because the fundamental load of the input second-order harmonic matching circuit 84 added to the high-frequency semiconductor device 202 is not open. This will be described below with reference to FIGS. 10 to 13.

Figure 10:
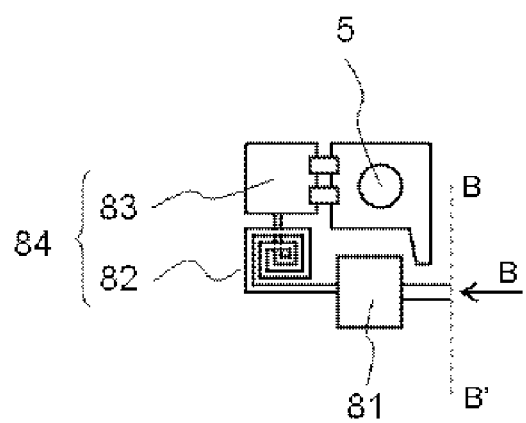
FIG. 10 is a diagram illustrating the input second-order harmonic matching circuit 84 of the second comparative example.

FIG. 10 is a diagram illustrating the input second-order harmonic matching circuit 84 of the second comparative example. In FIG. 10, an end face B-B' indicates a position near the input electrode of the unit transistor cell 7 and on a lead-out wire connecting the unit transistor cell 7 and the bonding pad 81. The end face B-B' also indicates a position near the input electrode of the unit transistor cell 7 and on a lead-out wire connecting the unit transistor cell 8 and the bonding pad 81.

Figure 11:
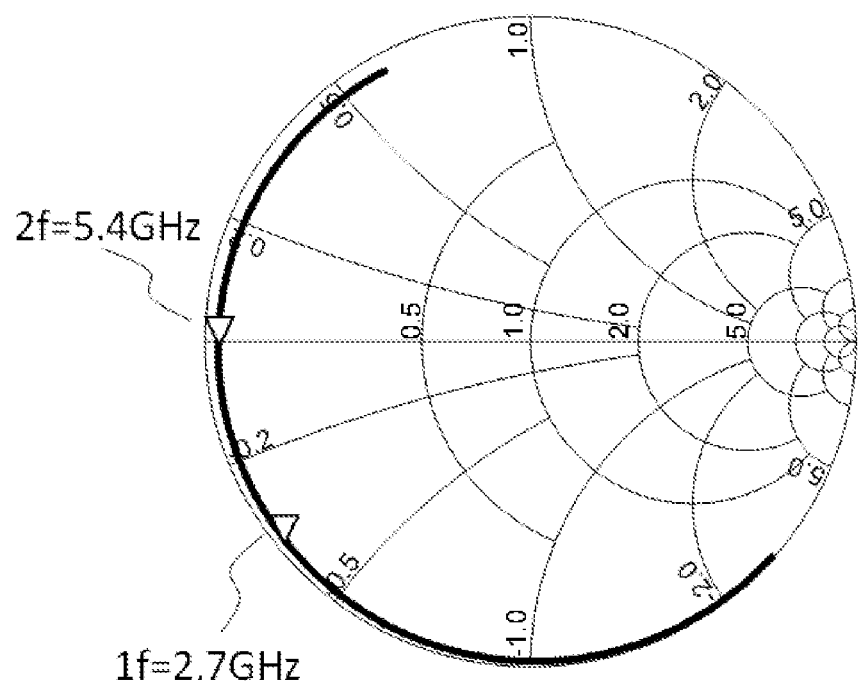
FIG. 11 is a Smith chart illustrating reflection characteristics of the input second-order harmonic matching circuit 84.

FIG. 11 is a Smith chart illustrating reflection characteristics of the input second-order harmonic matching circuit 84. This is a result of calculation of the reflection characteristics of the input second-order harmonic matching circuit 84 as seen in the direction of arrow B from the end face B-B' in FIG. 10 by electromagnetic analysis. In FIG. 11, markers indicate loads at 2.7 GHz corresponding to the fundamental wave and 5.4 GHz corresponding to the second-order harmonic.

As illustrated in FIG. 11, the load of the input second-order harmonic matching circuit 84 at 5.4 GHz corresponding to the second-order harmonic is short-circuited, in other words, at the left end of the Smith chart. The load of the input second-order harmonic matching circuit 84 at 2.7 GHz corresponding to the fundamental wave is in the lower half of the Smith chart, in other words, a capacitive load, and is not at the right end of the Smith chart, in other words, not opened. In other words, the input second-order harmonic matching circuit 84, the load of which is not opened is connected near each of the input electrodes of the unit transistor cells 7 and 8. Accordingly, the input fundamental wave loads of the unit transistor cells 7 and 8 change, and a characteristic change such as increase of a parasitic capacitor on the input side of the high-frequency semiconductor occurs.

Figure 12:
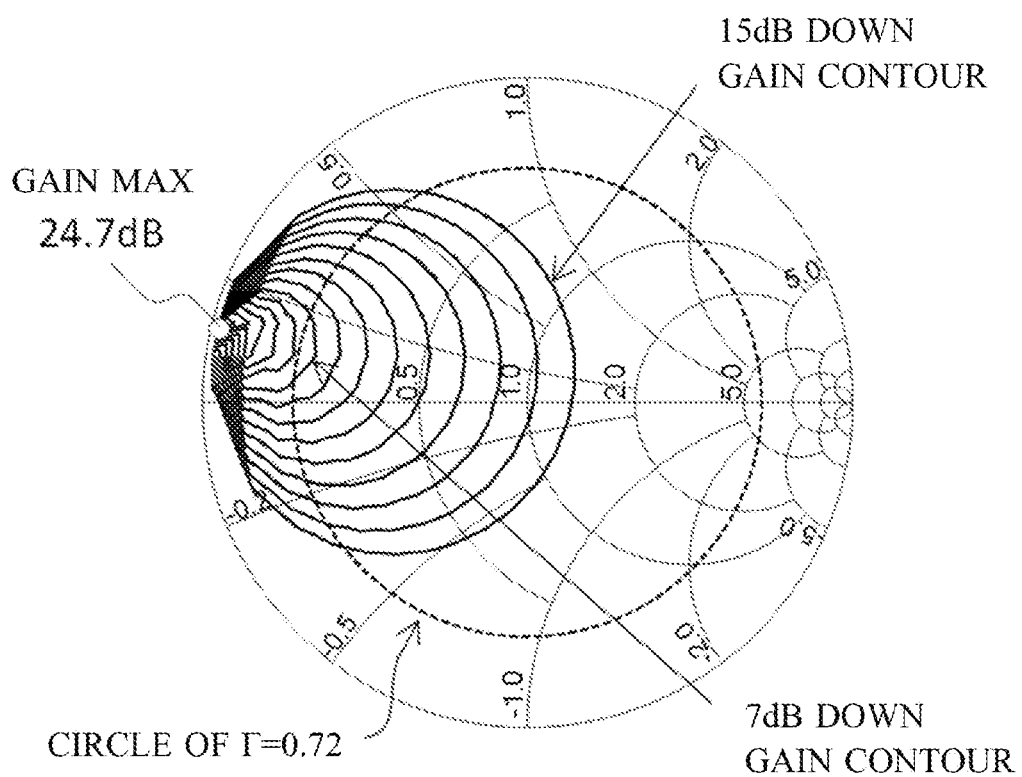
FIG. 12 is a diagram illustrating input load dependency of the gain of the high-frequency semiconductor device 201 according to the first comparative example.

FIG. 12 is a diagram illustrating input load dependency of the gain of the high-frequency semiconductor device 201 according to the first comparative example. FIG. 12 is a result of gain calculation by source-pull simulation and illustrates the maximum value of the gain and a load corresponding to the maximum value. Contours surrounding the load with which the maximum value can be obtained are contours connecting loads with which the gain at the maximum value down to 15 dB at the interval of 1 dB can be obtained. In particular, contours on which the amount of decrease of the gain is 15 dB and 7 dB are indicated with arrows.

The high-frequency semiconductor device 201 obtains a maximum gain of 24.7 dB when the load of the input matching circuit is an optimum load. The gain decreases as the load of the input matching circuit separates from the optimum load.

Figure 13:
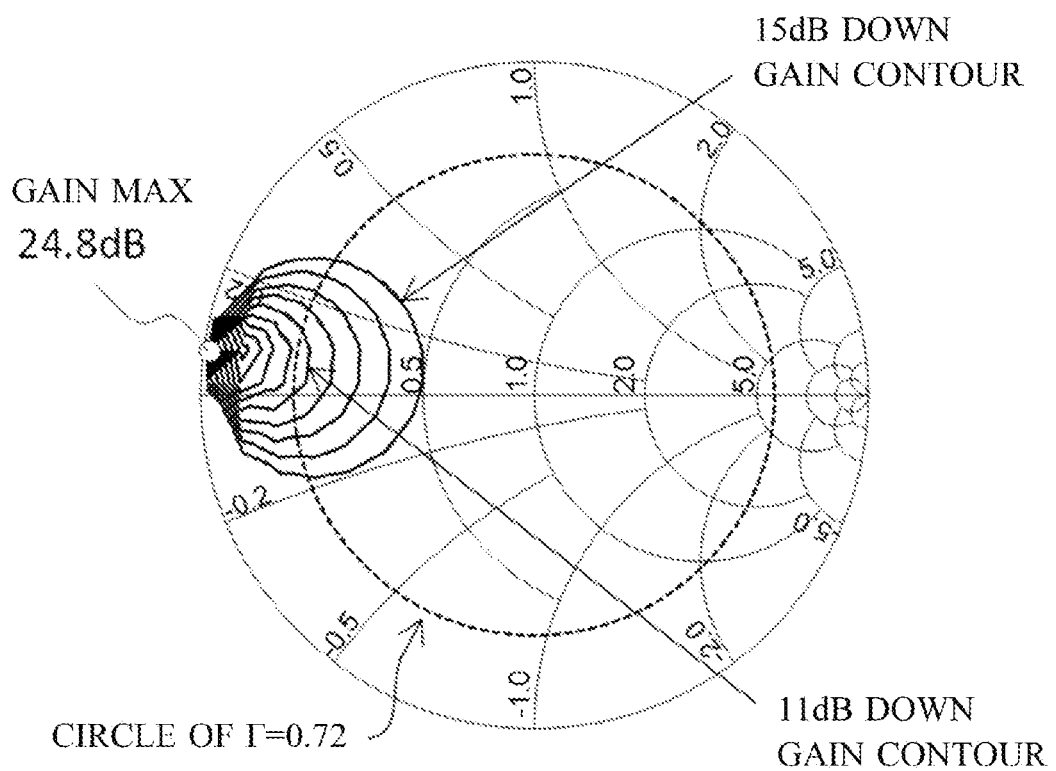
FIG. 13 is a diagram illustrating input load dependency of the gain of the high-frequency semiconductor device 202 according to the second comparative example.

FIG. 13 is a diagram illustrating input load dependency of the gain of the high-frequency semiconductor device 202 according to the second comparative example. Similarly to FIG. 12, FIG. 13 is a result of gain calculation by source-pull simulation and illustrates the maximum value of the gain and a load corresponding to the maximum value. Contours surrounding the load with which the maximum value can be obtained are contours connecting loads with which the gain at the maximum value down to 15 dB at the interval of 1 dB can be obtained. In particular, contours on which the amount of decrease of the gain is 15 dB and 11 dB are indicated with arrows.

As illustrated in FIG. 13, the high-frequency semiconductor device 202 obtains a maximum gain of 24.8 dB when the load of the input matching circuit is an optimum load. The gain decreases as the load of the input matching circuit separates from the optimum load.

In principle, when a capacitive circuit is connected on the input side, the gain can be returned to its original gain by providing an ideal input matching circuit outside the high-frequency semiconductor. Gain same as that in the first comparative example can be obtained in the second comparative example as well by adjusting a reflection phase when the absolute value (hereinafter, referred to as gamma) of the reflection coefficient of the input matching circuit can be set to be one or a value close to one.

However, in reality, it is difficult to achieve, with an input matching circuit of a finite size, an input matching circuit having a low passing loss and a high reflection coefficient, the gamma of which is one or close to one, and thus an ideal input matching circuit cannot be produced in reality.

A circle illustrated with a dotted line in FIGS. 12 and 13 is a circle corresponding to the gamma=0.72. This is a circle when the maximum value of the gamma of an input matching circuit having both a realistic size and a low passing loss is assumed to be 0.72. In other words, the gamma in the circle of the dotted line is a reflection characteristic that can be achieved, and the value of a contour in the circle of the dotted line is gain that can be achieved.

As illustrated FIG. 12, gain that can be achieved is approximately 19 dB at maximum. Contours in FIG. 13 are unevenly distributed nearer a short-circuit point, in other words, the left end of the Smith chart than those in FIG. 12. Since the input second-order harmonic matching circuit 84 having a capacitive load close to short circuit is connected to the bonding pad 81, the load of an input matching circuit outside the high-frequency semiconductor device to be matched needs to be close to short circuit, as well, to achieve high gain.

However, the gamma of an input matching circuit that can be achieved is limited to the inside of the circle of the dotted line, and thus, gain that can be achieved is approximately 15 dB at maximum. This is the factor of gain decrease of the high-frequency semiconductor device 204 using the high-frequency semiconductor device 202 including a conventional harmonic processing circuit.

An input second-order harmonic matching circuit, the load of which is opened for the fundamental wave and short-circuited for the second-order harmonic is needed to solve the problem. A tip short-circuited stub circuit having an electrical length equal to a quarter of the wavelength of the fundamental wave has been known as a typical method of achieving such a circuit. However, it is difficult to monolithically provide such a tip short-circuited stub circuit on a chip of a high-frequency semiconductor device, due to size matters.

For example, the specific dielectric constant εr of gallium arsenide is largest at 12.8 among silicon, silicon carbide, gallium arsenide, and gallium nitride described above. When the frequency of the fundamental wave is 2.7 GHz, the space wavelength of gallium arsenide, the specific dielectric constant of which is 12.8, is approximately 31.1 mm, and a dimension corresponding to the electrical length of a quarter of the wavelength is approximately 7.8 mm.

The chip size of the high-frequency semiconductor device 100 is approximately 1 mm square. Thus, it is difficult to monolithically produce the stub inside the high-frequency semiconductor, and it is further difficult to provide one stub to each bonding pad.

Figure 14:
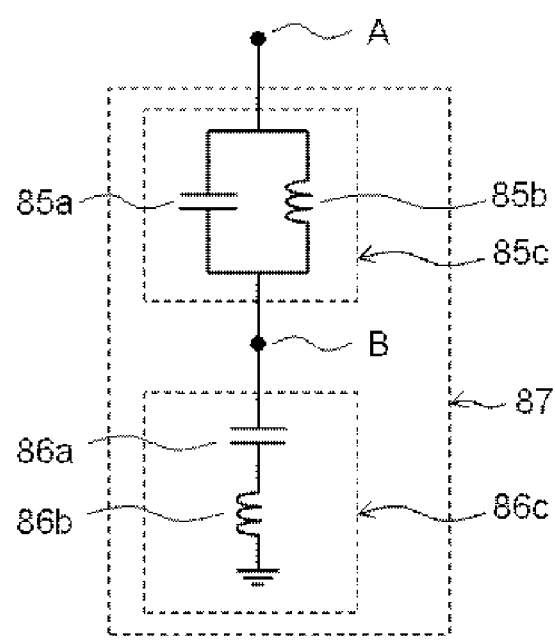
FIG. 14 is a diagram illustrating an exemplary input second-order harmonic matching circuit configured as a lumped parameter circuit.

In another method of achieving an input second-order harmonic matching circuit, the load of which is opened for the fundamental wave and short-circuited for the second-order harmonic, a lumped parameter circuit including an MIM capacitor and a spiral inductor is used as illustrated in FIG. 14.

FIG. 14 is a diagram illustrating an exemplary input second-order harmonic matching circuit configured as a lumped parameter circuit. This input second-order harmonic matching circuit 87 includes a capacitor 85a, an inductor 85b, a capacitor 86a, and an inductor 86b. The capacitor 85a and the inductor 85b form a resonance circuit 85c configured to resonate for the fundamental wave. The resonance circuit 85c is a parallel resonance circuit for the fundamental wave when the input second-order harmonic matching circuit 87 is seen by a terminal A, and thus the load of the input second-order harmonic matching circuit 87 as seen by the terminal A is opened for the fundamental wave even when an optional load is connected beyond a node B.

Subsequently, the capacitor 86a and the inductor 86b are connected to the node B. The load of the input second-order harmonic matching circuit 87 as seen by the terminal A can be short-circuited for the second-order harmonic by adjusting the inductor 86b. The capacitor 86a is a direct-current cutoff capacitor.

To improve the power added efficiency, the input second-order harmonic matching circuit 84 is desirably provided to each bonding pad 81 like the high-frequency semiconductor device 202 illustrated in FIG. 5. This is because it is easier to achieve a large reflection coefficient and an ideal short-circuited phase when divided input second-order harmonic matching circuits are provided immediately before a unit transistor cell than when a matching circuit for optimizing an input second-order harmonic load is provided outside the high-frequency semiconductor and connected to a gate pad by using a bonding wire.

However, the area of a semiconductor chip significantly increases, for example, when the input second-order harmonic matching circuit 84 in the high-frequency semiconductor device 202 is replaced with the input second-order harmonic matching circuit 87 illustrated in FIG. 3. In particular, from a viewpoint of cost increase, it is difficult to form a direct-current cutoff capacitor, which needs a large chip area, for each gate pad.

The inventor focused on a fact that, even when the two bonding pads 11 and 12 are separated as in the high-frequency semiconductor device 100 and connected to each other through the gate feeder 9 having resistance, operation is same as in a state in which the two bonding pads are connected to each other through a conductor having no resistance, as long as the phases of high-frequency signals input to the two bonding pads are same.

The interval between the bonding pads is the product of the width of each transistor corresponding to one finger and included in each unit transistor cell and the number of transistors. A larger width of each transistor corresponding to one finger is more advantageous for heat resistance reduction but causes change of the size of a semiconductor, and thus the width is typically 20 μm and 50 μm. The number of transistors in a set is typically about 10 at maximum to achieve uniform input power in a cell. Thus, the interval between the bonding pads is typically 0.5 mm or smaller.

For example, the space wavelength of gallium arsenide is approximately 31.1 mm when the material of the semiconductor substrate is gallium arsenide, the specific dielectric constant of which is 12.8, the interval between the bonding pads is 0.5 mm, and the frequency of the fundamental wave is 2.7 GHz. Accordingly, the difference between the phases of the bonding pads at the interval of 0.5 mm is 5.8° at maximum, and thus the phases can be regarded substantially same.

In other words, the phases of bonding pads connected to adjacent unit transistor cells can be regarded substantially same. Note that the specific dielectric constant of gallium arsenide is largest among silicon, silicon carbide, gallium arsenide, and gallium nitride, and the phase difference is further smaller with another material.

In light of the foregoing, the input second-order harmonic matching circuit 19 of the high-frequency semiconductor device 100 according to the first embodiment will be described below.

Figure 15:
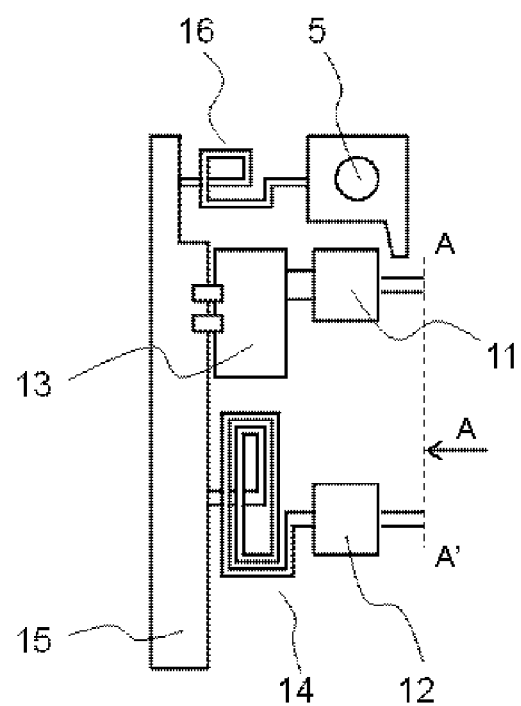
FIG. 15 is an extracted diagram of the input second-order harmonic matching circuit 19 in FIG. 1.

FIG. 15 is an extracted diagram of the input second-order harmonic matching circuit 19 in FIG. 1. In FIG. 15, an end face A-A' indicates a position near the input electrode of the unit transistor cell 7 and on a lead-out wire connecting the unit transistor cell 7 and the bonding pad 11. The end face A-A' also indicates a position near the input electrode of the unit transistor cell 8 and on a lead-out wire connecting the unit transistor cell 8 and the bonding pad 12.

Figure 16:
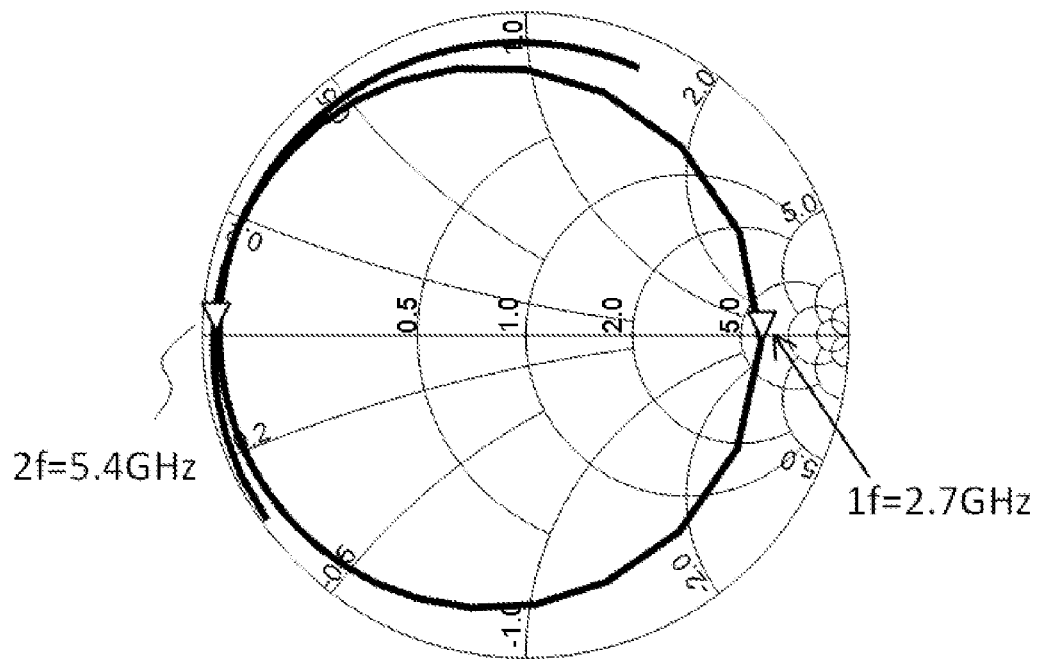
FIG. 16 is a Smith chart illustrating reflection characteristics of the input second-order harmonic matching circuit 19.

FIG. 16 is a Smith chart illustrating reflection characteristics of the input second-order harmonic matching circuit 19. This is a result of calculation of the reflection characteristics of the input second-order harmonic matching circuit 19 as seen in the direction of arrow A from the end face A-A' in FIG. 15 by electromagnetic analysis. In FIG. 16, markers indicate loads at 2.7 GHz corresponding to the fundamental wave and 5.4 GHz corresponding to the second-order harmonic.

The fundamental wave resonance circuit 19a is a parallel resonance circuit configured to resonate for the fundamental wave as seen from the end face A-A' in FIG. 15. Thus, as illustrated in FIG. 16, the phase of the reflection coefficient of the input second-order harmonic matching circuit 19 for the fundamental wave (2.7 GHz) is 180°, in other words, opened. Any load connected to a connection point between the capacitor 15 and the inductor 16 does not affect the reflection coefficient of the input second-order harmonic matching circuit 19 for the fundamental wave.

The reflection coefficient of the input second-order harmonic matching circuit 19 is short-circuited for the second-order harmonic (5.4 GHz).

When the capacitor 15 and the inductor 16 forming the second-order harmonic resonance circuit 19b resonate for the second-order harmonic, the phase of the reflection coefficient of the input second-order harmonic matching circuit 19 as seen from the end face A-A' in FIG. 15 is different from a short-circuited phase mainly due to influence of the capacitor 13. Thus, the inductance of the inductor 16 is adjusted so that the reflection coefficient of the input second-order harmonic matching circuit 19 as seen from the end face A-A' in FIG. 15 is short-circuited for the second-order harmonic, in other words, 180°. As a result, the second-order harmonic resonance circuit 19b is set to resonate at a frequency beyond the frequency of the fundamental wave and lower than the frequency of the second-order harmonic.

Note that the terms "opened" and "short-circuited" in the present specification are used in conceptual meanings, and "opened" means that the phase of the reflection coefficient when a circuit is seen is substantially 180° and the absolute value of the reflection coefficient is sufficiently large. In addition, "short-circuited" means that the phase of the reflection coefficient when a circuit is seen is substantially 0° and the absolute value of the reflection coefficient is sufficiently large.

Ideally, "opened" means a state in which impedance is infinite, and "short-circuited" means a state in which impedance is zero. However, an actual circuit element inevitably has a loss, and impedance of zero and infinite cannot be achieved, but effects for practical use can be obtained in harmonic processing without ideal "short-circuited" and "opened". Note that, to obtain the effects, it suffices that the absolute value of the impedance of the harmonic is equal to or smaller than $\frac{1}{5}$ or equal to or larger than five times the impedance of the fundamental wave, and that the phase is within ±15° of a short-circuited or opened phase.

Subsequently, calculation results of performance of the high-frequency semiconductor device 110 according to the first embodiment are presented.

Figure 17:
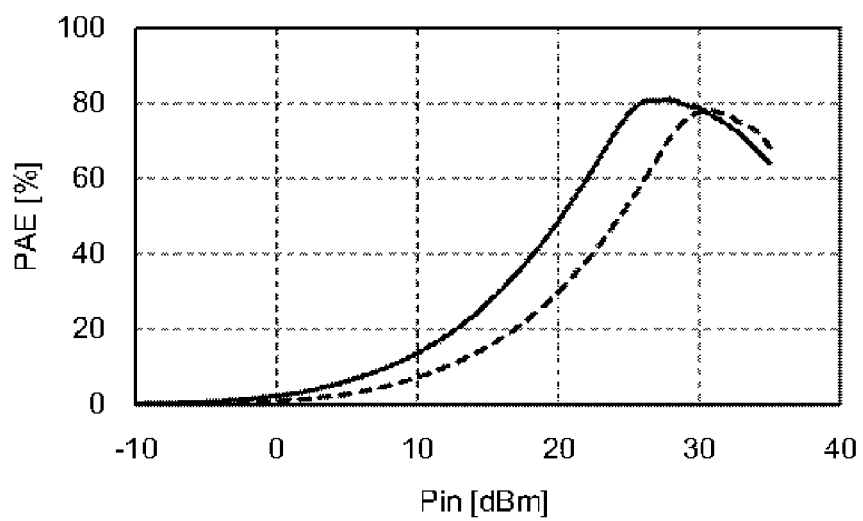
FIG. 17 is a diagram illustrating a calculation result of the power added efficiency of the high-frequency semiconductor device 110.

FIG. 17 is a diagram illustrating a calculation result of the power added efficiency of the high-frequency semiconductor device 110. In FIG. 17, the horizontal axis represents input power, and the vertical axis represents the power added efficiency. The frequency of the fundamental wave input to the high-frequency semiconductor device 110 was 2.7 GHz. In FIG. 17, a solid line represents the calculation result of the high-frequency semiconductor device 110, and a dotted line represents the calculation result of the high-frequency semiconductor device 204 (the second comparative example).

The high-frequency semiconductor device 110 has a maximum efficiency value of 81.1% at the input power Pin=28 dBm. The high-frequency semiconductor device 204 has a maximum efficiency value of 77.9% at the input power of Pin=31 dBm. Thus, the high-frequency semiconductor device 110 can obtain power load added efficiency higher than that of the high-frequency semiconductor device 204.

Figure 18:
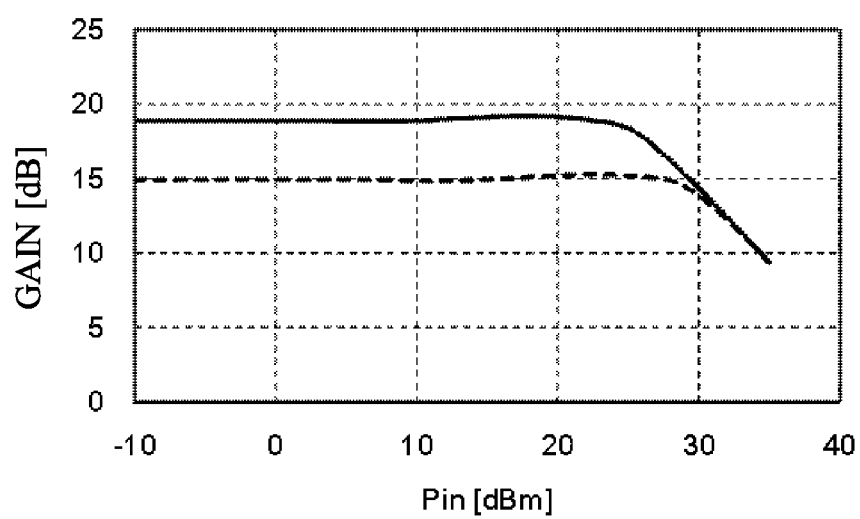
FIG. 18 is a diagram illustrating a calculation result of the gain of the high-frequency semiconductor device 110.

FIG. 18 is a diagram illustrating a calculation result of the gain of the high-frequency semiconductor device 110. In FIG. 18, the horizontal axis represents input power, and the vertical axis represents the gain. The frequency of the fundamental wave input to the high-frequency semiconductor device 110 was 2.7 GHz. In FIG. 18, a solid line represents the calculation result of the high-frequency semiconductor device 110, and a dotted line represents the calculation result of the high-frequency semiconductor device 204 (the second comparative example).

The gain of the high-frequency semiconductor device 110 is approximately 19 dB in a range in which the input power is equal to or smaller than 20 dBm. This is substantially equal to the gain of the high-frequency semiconductor device 203 (the first comparative example) illustrated in FIG. 9. The gain of the high-frequency semiconductor device 204 (the second comparative example) is approximately 15 dB in a range in which the input power is equal to or smaller than 20 dBm. Thus, the high-frequency semiconductor device 110 can obtain gain higher than that of the high-frequency semiconductor device 204.

As described above, the high-frequency semiconductor device 100 according to the first embodiment includes: the semiconductor substrate 1; the first unit transistor cell 7 and the second unit transistor cell 8 provided adjacent to each other on the upper surface of the semiconductor substrate 1, each unit transistor cell being constituted by a plurality of multi-finger transistors having input electrodes connected in parallel and output electrodes connected in parallel; the first capacitor 13 provided on the upper surface of the semiconductor substrate 1 and having one end connected to the input electrode of the first unit transistor cell 7; the first inductor 14 provided on the upper surface of the semiconductor substrate 1 and having one end connected to the input electrode of the second unit transistor cell 8; the second capacitor 15 provided on the upper surface of the semiconductor substrate 1 and having one end connected to the other end of the first capacitor 13 and the other end of the first inductor 14; and the second inductor 16 provided on the upper surface of the semiconductor substrate 1, having one end connected to the other end of the second capacitor 15, and having the other end connected to the ground terminal, the first capacitor 13 and the first inductor 14 resonate at the frequency of the fundamental wave, and each of impedance on the first capacitor 13 side as seen by the input electrode of the first unit transistor cell 7 and impedance on the first inductor 14 side as seen by the input electrode of the second unit transistor cell 8 is short-circuited for the second-order harmonic.

The high-frequency semiconductor device 100 according to the first embodiment includes a resistor connecting the input electrode of the first unit transistor cell 7 and the input electrode of the second unit transistor cell 8.

The high-frequency semiconductor device 100 according to the first embodiment further includes: the first bonding pad 11 provided on the upper surface of the semiconductor substrate 1 and connecting the one end of the first capacitor 13 and the input electrode of the first unit transistor cell 7; the second bonding pad 12 provided on the upper surface of the semiconductor substrate 1 and connecting the one end of the first inductor 14 and the input electrode of the second unit transistor cell 8; and the output bonding pad 10 provided on the upper surface of the semiconductor substrate 1 and connected to the output electrodes of the first unit transistor cell 7 and the second unit transistor cell 8.

The high-frequency semiconductor device 110 according to the first embodiment further includes: the input matching circuit 22 including the input terminal 21 to which a signal is input, and connected to the first bonding pad 11 and the second bonding pad 12; and the output matching circuit 23 including the output terminal 24 from which a signal is output, and connected to the output bonding pad 10.

With such a configuration, the reflection coefficient of the input second-order harmonic matching circuit 19 can be set to be opened for the fundamental wave and short-circuited for the second-order harmonic, and thus the high-frequency semiconductor device 110 can achieve both high power added efficiency and high gain.

One input second-order harmonic matching circuit 19 is shared by two adjacent unit transistor cells. In particular, the direct-current cutoff capacitor 15, which needs a large chip area, is shared, and thus the area of the high-frequency semiconductor device 100 can be reduced.

Since the gate electrodes of the unit transistor cells 7 and 8 are connected in parallel through the gate feeder 9 as a resistor, oscillation can be prevented. Typically, it is more important to prevent oscillation as gain is higher. In the high-frequency semiconductor device 110 that achieves high gain as described above, the effect of oscillation suppression by the gate feeder 9 more effectively functions.

Note that, although an example of the high-frequency semiconductor device 100 including two unit transistor cells on a semiconductor substrate is described in the first embodiment, a larger number of unit transistor cells may be included for output power improvement.

Figure 19:
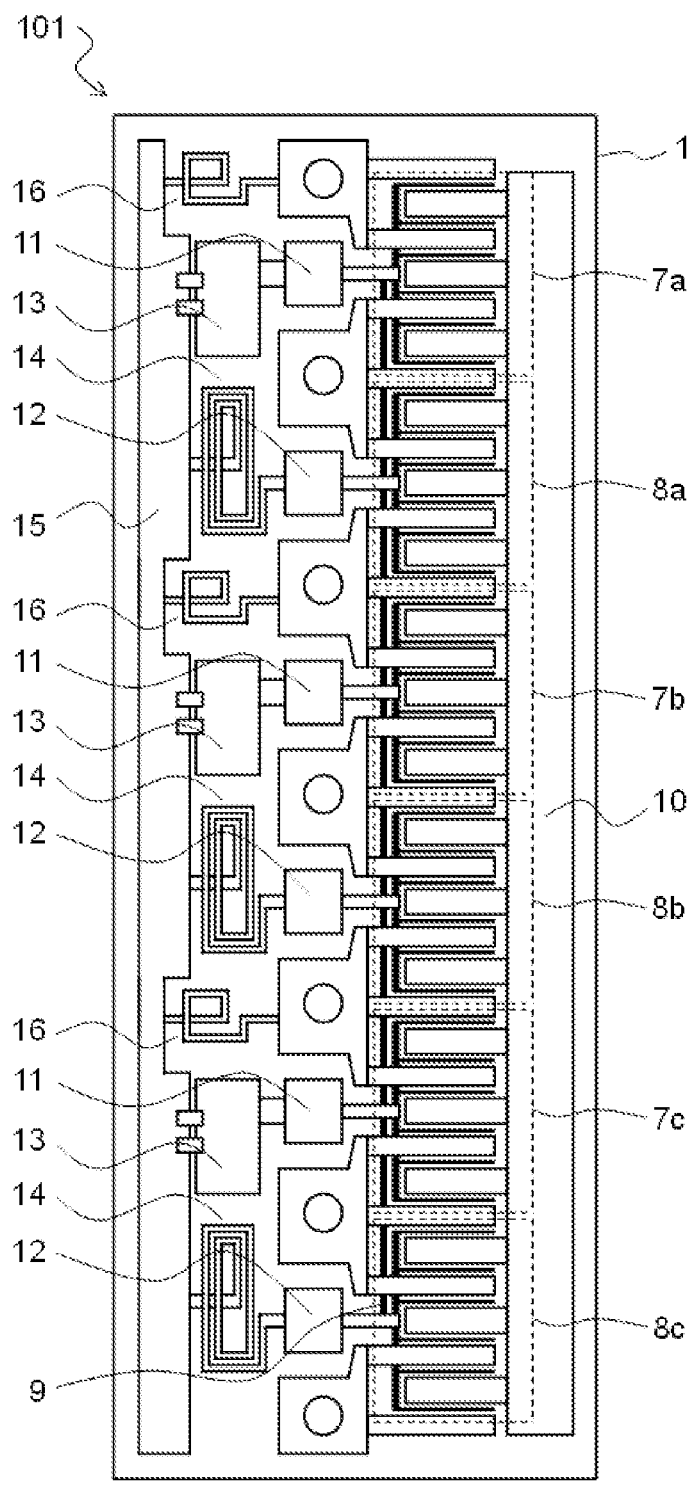
FIG. 19 is a diagram illustrating a high-frequency semiconductor device 101 as a modification of the first embodiment.
Figure 20:
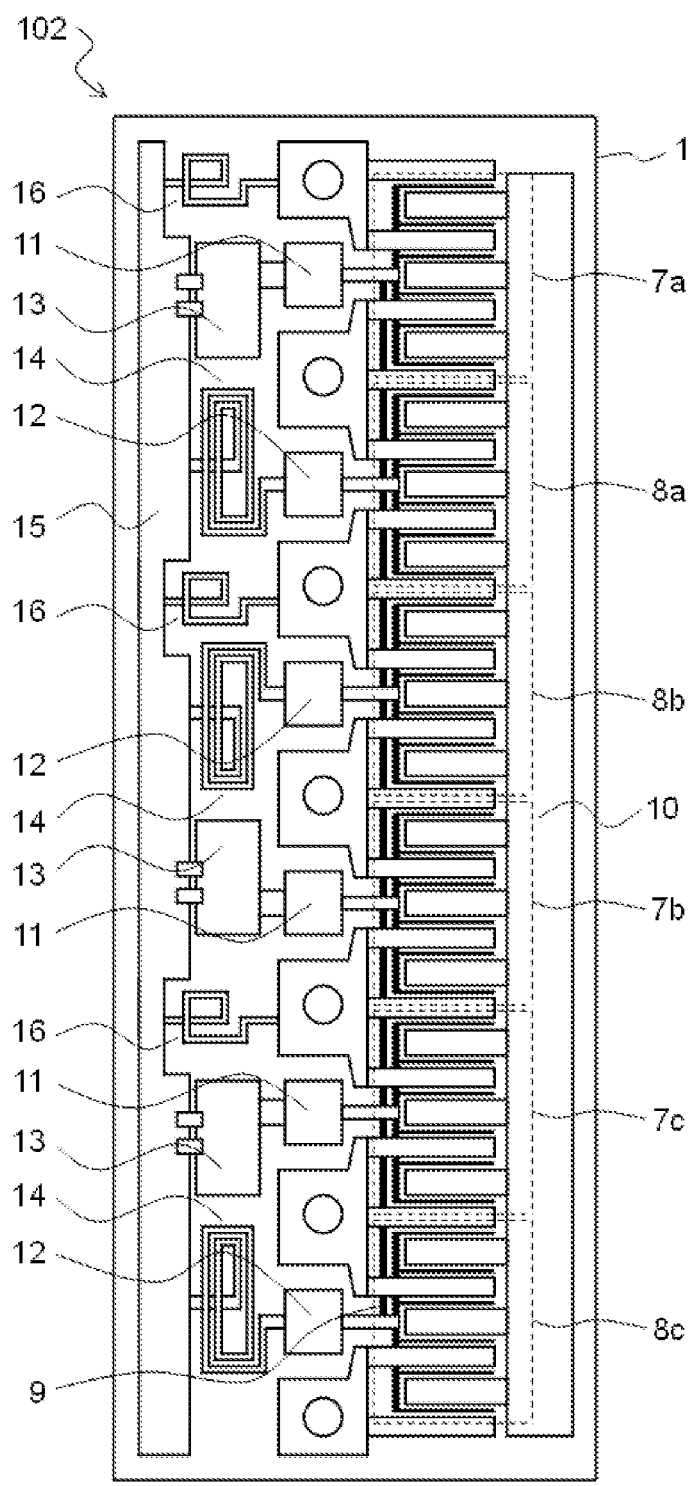
FIG. 20 is a diagram illustrating a high-frequency semiconductor device 102 as a modification of the first embodiment.

Such modifications are illustrated in FIGS. 19 and 20. FIG. 19 is a diagram illustrating a high-frequency semiconductor device 101 as a modification of the first embodiment, and FIG. 20 is a diagram illustrating a high-frequency semiconductor device 102 as a modification of the first embodiment. In FIGS. 19 and 20, 7a to 7c denote first unit transistor cells, and 8a to 8c denote second unit transistor cells.

As illustrated in FIG. 19, six unit transistor cells are linearly provided adjacent to each other in the order of 7a, 8a, 7b, 8b, 7c, and 8c on the semiconductor substrate 1 of the high-frequency semiconductor device 101. Gate electrodes of the unit transistor cells 7a and 8a, gate electrodes of the unit transistor cells 7b and 8b, and gate electrodes of the unit transistor cells 8a and 8b are each connected through the gate feeder 9. Oscillation including loop oscillation can be prevented by setting a certain resistance value to the gate feeder 9. Drain electrodes of the unit transistor cells 7a to 7c and 8a to 8c are connected to the output bonding pad 10, in other words, the output bonding pad 10 is shared.

The gate electrodes of the unit transistor cells 7a to 7c are each connected to the bonding pad 11 provided on the upper surface of the semiconductor substrate 1 through a lead-out wire, and the bonding pad 11 is connected to the capacitor 13. The gate electrodes of the unit transistor cells 8a to 8c are each connected to the bonding pad 12 provided on the upper surface of the semiconductor substrate 1 through a lead-out wire, and the bonding pad 12 is connected to the inductor 14.

The high-frequency semiconductor device 101 includes three capacitors 13 and three inductors 14 connected to one end of one capacitor 15. In other words, the capacitor 15 is shared. The other end of the capacitor 15 is connected to one end of each of the three inductors 16.

In the high-frequency semiconductor device 101, the unit transistor cell 7a as a first unit transistor cell is provided adjacent to the unit transistor cell 8a as a second unit transistor cell. Similarly, the unit transistor cells 7b and 8b are provided adjacent to each other, and the unit transistor cells 7c and 8c are provided adjacent to each other. In the entire high-frequency semiconductor device 101, the first unit transistor cells 7a to 7c and the second unit transistor cells 8a to 8c are alternately arranged. Description of the other configuration is omitted.

In the high-frequency semiconductor device 102 illustrated in FIG. 20, six unit transistor cells are linearly provided adjacent to each other in the order of 7a, 8a, 8b, 7b, 7c, and 8c. Similarly to the high-frequency semiconductor device 101 illustrated in FIG. 19, in the high-frequency semiconductor device 102 as well, the unit transistor cells 7a and 8a are provided adjacent to each other, the unit transistor cells 7b and 8b are provided adjacent to each other, and the unit transistor cells 7c and 8c are provided adjacent to each other. However, the unit transistor cells 8a and 8b are provided adjacent to each other, and the unit transistor cells 7b and 7c are provided adjacent to each other. Thus, unlike the high-frequency semiconductor device 101, the first unit transistor cells and the second unit transistor cells are not alternately arranged in the entire high-frequency semiconductor device 102.

The high-frequency semiconductor devices 101 and 102 thus configured perform completely equivalent operation. In other words, when a first unit transistor cell and a second unit transistor cell are considered as a pair, the orientations of the pairs may be same or different. Description of the other configuration is omitted.

Similarly to the high-frequency semiconductor device 110, the high-frequency semiconductor devices 101 and 102 thus configured can achieve both high power added efficiency and high gain.

Note that, although the high-frequency semiconductor device 100 exemplarily includes two unit transistor cells and the high-frequency semiconductor devices 101 and 102 each exemplarily include six unit transistor cells, needless to say, the number of unit transistor cells included in a high-frequency semiconductor device is not limited to two nor six.

Second Embodiment

The second embodiment will be described below. Description of any part having a configuration and operation same as those described in the first embodiment is omitted in some cases. Note that the second embodiment may be performed in combination with the modification of the first embodiment.

Figure 21:
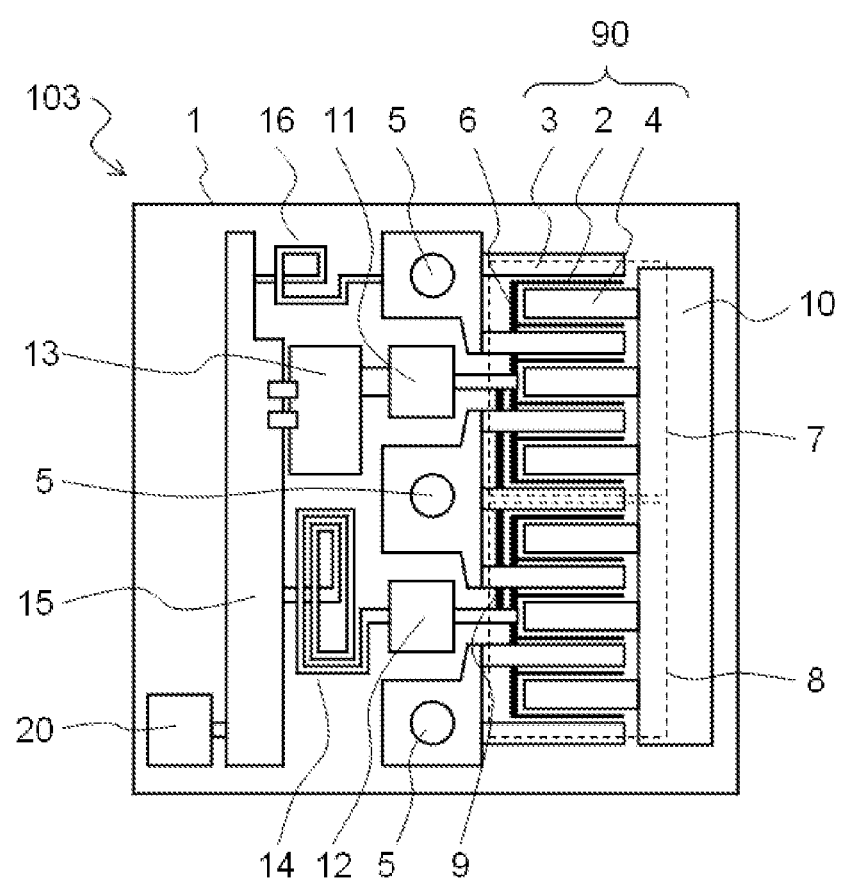
FIG. 21 is a plan view of a high-frequency semiconductor device 103 according to the second embodiment.

FIG. 21 is a plan view of a high-frequency semiconductor device 103 according to the second embodiment.

In the high-frequency semiconductor device 103, unlike the high-frequency semiconductor device 100, a bonding pad 20 as a third bonding pad is provided on the upper surface of the semiconductor substrate 1 of the high-frequency semiconductor device 103. The bonding pad 20 is connected to one end of the capacitor 15 as a second capacitor. The other configuration is same as that of the high-frequency semiconductor device 100.

Figure 22:
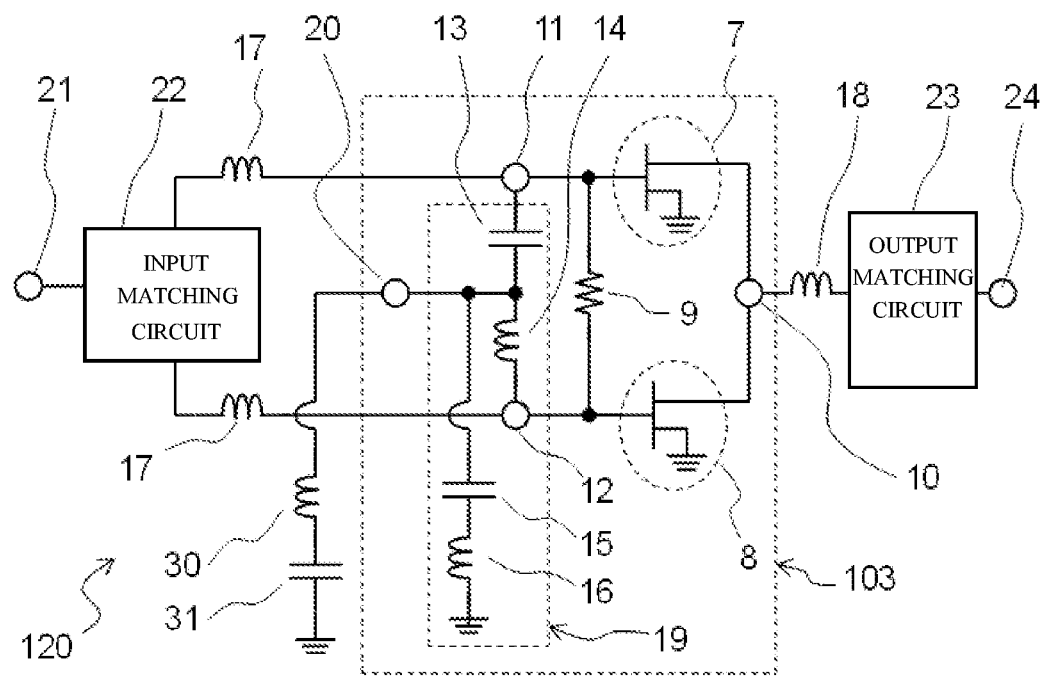
FIG. 22 is an equivalent circuit diagram of a high-frequency semiconductor device 120 according to the second embodiment.

FIG. 22 is an equivalent circuit diagram of a high-frequency semiconductor device 120 according to the second embodiment.

Unlike the high-frequency semiconductor device 110, the high-frequency semiconductor device 120 includes the high-frequency semiconductor device 103. A bonding wire 30 as an inductor has one end connected to the bonding pad 20 provided in the high-frequency semiconductor device 103. The other end of the bonding wire 30 is connected to one end of a capacitor 31. The capacitor 31 is provided near the high-frequency semiconductor device 103 in a housing of the high-frequency semiconductor device 120. The other end of the capacitor 31 is fixed and conducted to the housing of the high-frequency semiconductor device 120 through a joining material such as solder or a conductive bonding agent. The housing of the high-frequency semiconductor device 120 provides ground potential, and the other end of the capacitor 31 is grounded. The other configuration is same as that of the high-frequency semiconductor device 110.

One of main usages of a high-frequency semiconductor device is a communication power amplifier. In a communication usage, information is superimposed on a carrier (carrier wave) by modulating the carrier. For example, modulation frequency in a modulation scheme used for a cellular phone is several MHz to several tens MHz, which is lower than that of the carrier. It is known that an unnecessary distortion signal can be prevented from being generated from the high-frequency semiconductor device by short-circuiting, at the modulation frequency, the load of an input matching circuit as seen by input of the high-frequency semiconductor.

Thus, in the high-frequency semiconductor device 120, the capacitor 31 is configured as a large-capacity capacitor in, for example, the order of micro F, with which short circuit is achieved at the modulation frequency. Since the capacitor 31 is provided near the high-frequency semiconductor device 103, the bonding wire 30 is short and the inductance thereof is small enough to regard the bonding wire 30 as being short-circuited at the modulation frequency. Moreover, the size of the inductor 14 formed on the semiconductor substrate 1 is small and the inductance thereof has no influence at the modulation frequency, and thus the inductor 14 can be regarded as being short-circuited. Accordingly, the input load of the input second-order harmonic matching circuit 19 as seen by the input electrodes of the unit transistor cells 7 and 8 is short-circuited. Thus, an unnecessary distortion signal can be prevented from being generated from the high-frequency semiconductor device 103 in the high-frequency semiconductor device 120 according to the second embodiment.

On the other hand, for the fundamental wave, any optional load connected to the connection point between the capacitor 15 and the inductor 16 does not affect the reflection coefficient of the input second-order harmonic matching circuit 19 for the fundamental wave. The load of the input second-order harmonic matching circuit 19 remains short-circuited for the second-order harmonic by setting the inductance of the bonding wire 30 to be sufficiently large so that the load of the bonding wire 30 is opened for the second-order harmonic.

As described above, the high-frequency semiconductor device 103 according to the second embodiment includes: the semiconductor substrate 1; the first unit transistor cell 7 and the second unit transistor cell 8 provided adjacent to each other on the upper surface of the semiconductor substrate 1, each unit transistor cell being constituted by a plurality of multi-finger transistors having input electrodes connected in parallel and output electrodes connected in parallel; the first capacitor 13 provided on the upper surface of the semiconductor substrate 1 and having one end connected to the input electrode of the first unit transistor cell 7; the first inductor 14 provided on the upper surface of the semiconductor substrate 1 and having one end connected to the input electrode of the second unit transistor cell 8; the second capacitor 15 provided on the upper surface of the semiconductor substrate 1 and having one end connected to the other end of the first capacitor 13 and the other end of the first inductor 14; and the second inductor 16 provided on the upper surface of the semiconductor substrate 1, having one end connected to the other end of the second capacitor 15, and having the other end connected to the ground terminal, the first capacitor 13 and the first inductor 14 resonate at the frequency of the fundamental wave, and each of impedance on the first capacitor 13 side as seen by the input electrode of the first unit transistor cell 7 and impedance on the first inductor 14 side as seen by the input electrode of the second unit transistor cell 8 is short-circuited for the second-order harmonic.

The high-frequency semiconductor device 103 according to the second embodiment further includes: the first bonding pad 11 provided on the upper surface of the semiconductor substrate 1 and connecting the one end of the first capacitor 13 and the input electrode of the first unit transistor cell 7; the second bonding pad 12 provided on the upper surface of the semiconductor substrate 1 and connecting the one end of the first inductor 14 and the input electrode of the second unit transistor cell 8; the output bonding pad 10 provided on the upper surface of the semiconductor substrate 1 and connected to the output electrodes of the first unit transistor cell 7 and the second unit transistor cell 8; and the third bonding pad 20 provided on the upper surface of the semiconductor substrate 1 and connected to the one end of the second capacitor 15.

The high-frequency semiconductor device 120 according to the second embodiment further includes: the input matching circuit 22 including the input terminal 21 to which a signal is input, and connected to the first bonding pad 11 and the second bonding pad 12; the output matching circuit 23 including the output terminal 24 from which a signal is output, and connected to the output bonding pad 10; an inductor 30 having one end connected to the third bonding pad 20; and the capacitor 31 having one end connected to the other end of the inductor 30 and having the other end grounded.

The inductor 30 has inductance that is opened at a frequency twice the carrier frequency of the signal input to the input terminal 21 and that is short-circuited at the modulation frequency of the signal input to the input terminal 21, and the capacitor 31 has capacitance that is short-circuited at the modulation frequency.

With such a configuration, the phase of the reflection coefficient of the input second-order harmonic matching circuit 19 can be set to be opened for the fundamental wave and short-circuited for the second-order harmonic, and thus, similarly to the high-frequency semiconductor device 110, the high-frequency semiconductor device 120 can achieve both high power added efficiency and high gain.

Moreover, since the capacitor 31 is connected to the input second-order harmonic matching circuit 19, the input load of the input second-order harmonic matching circuit 19 as seen by the input electrodes of the unit transistor cells 7 and 8 is short-circuited at the modulation frequency. Accordingly, in the high-frequency semiconductor device 120 according to the second embodiment, an unnecessary distortion signal can be prevented from being generated from the high-frequency semiconductor device 103.

Note that the state in which the load of the bonding wire 30 is opened may be such that the load is sufficiently larger than that of the second-order harmonic resonance circuit 19b, for example, the inductance of the bonding wire 30 is more than 10 times larger than that of the inductor 16 as a guide. When the inductance of the bonding wire 30 is insufficient alone, another inductor may be connected in series to complement inductance insufficiency.

Third Embodiment

The third embodiment will be described below. Description of any part having a configuration and operation same as those described in the first or second embodiment is omitted in some cases. The third embodiment may be performed in combination with the modification of the first embodiment.

Figure 23:
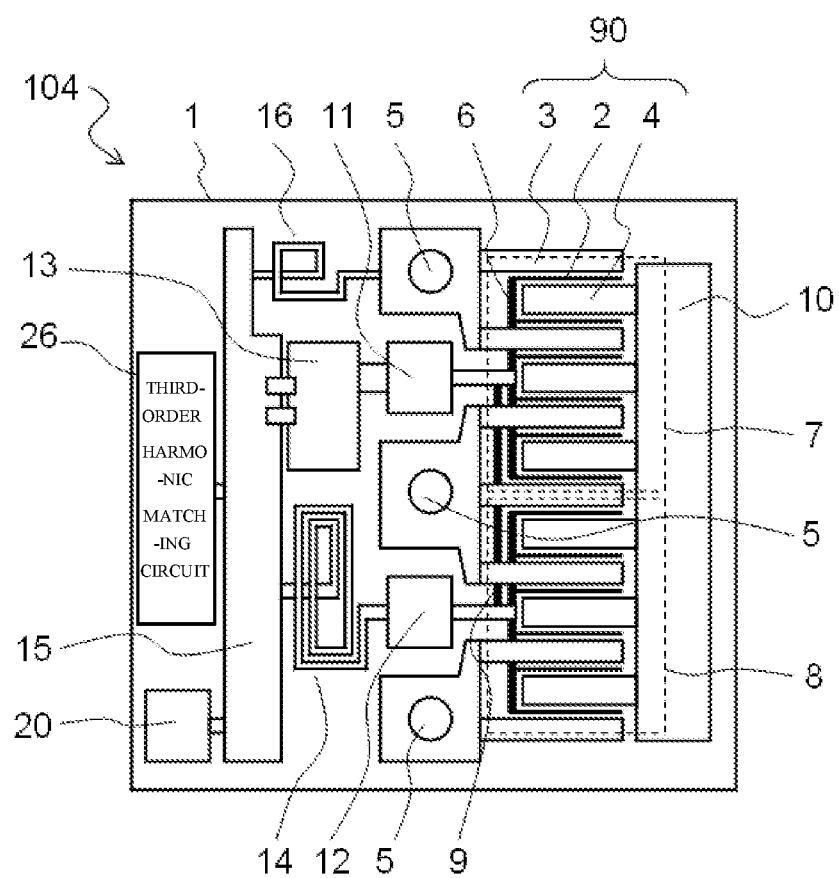
FIG. 23 is a plan view of a high-frequency semiconductor device 104 according to the third embodiment.

FIG. 23 is a plan view of a high-frequency semiconductor device 104 according to the third embodiment.

The high-frequency semiconductor device 104 is different from the high-frequency semiconductor device 103 in that a third-order harmonic matching circuit 26 is provided on the upper surface of the semiconductor substrate 1, and the other configuration thereof is same as that of the high-frequency semiconductor device 103. In addition, the high-frequency semiconductor device 104 is different from the high-frequency semiconductor device 100 in that the bonding pad 20 as a third bonding pad and the third-order harmonic matching circuit 26 are provided on the upper surface of the semiconductor substrate 1, and the other configuration thereof is same as that of the high-frequency semiconductor device 100.

The third-order harmonic matching circuit 26 is connected to one end of the capacitor 15 as a second capacitor. In other words, the third-order harmonic matching circuit 26 is connected to the other end of the capacitor 13 and the other end of the inductor 14.

The circuit constant of the third-order harmonic matching circuit 26 is set so that each of impedance on the first capacitor 13 side as seen by the input electrode of the first unit transistor cell 7 and impedance on the first inductor 14 side as seen by the input electrode of the second unit transistor cell 8 is short-circuited at the frequency of a third-order harmonic.

The third-order harmonic matching circuit 26 may be constituted by circuit elements such as an MIM, a capacitor, an inductor, a transmission line, and a via hole. The third-order harmonic matching circuit 26 may be configured as a distributed parameter circuit, a lumped parameter circuit, or a mixture circuit thereof. The third-order harmonic matching circuit 26 may be, for example, a series resonance circuit of a capacitor and an inductor, a parallel resonance circuit, a short circuit stub, an open stub, a transmission line, or a combination thereof. Impedance can be highly accurately managed for the third-order harmonic of high frequency by manufacturing the above-described components on the semiconductor substrate 1 through a semiconductor process of high manufacturing accuracy.

Figure 24:
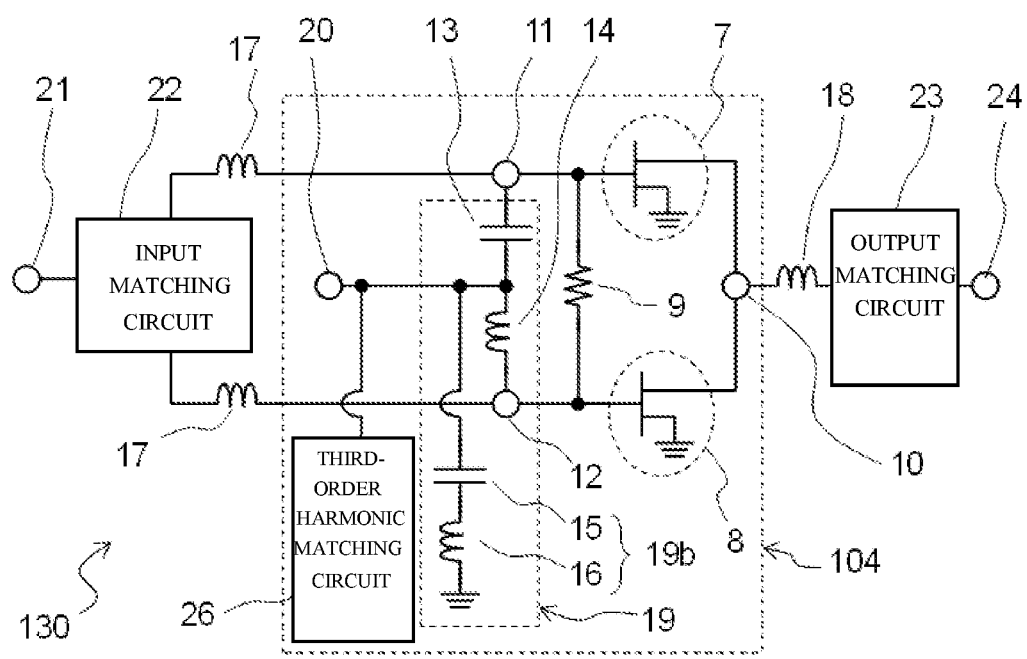
FIG. 24 is an equivalent circuit diagram of a high-frequency semiconductor device 130 according to the third embodiment.

FIG. 24 is an equivalent circuit diagram of a high-frequency semiconductor device 130 according to the third embodiment. Unlike the high-frequency semiconductor device 110, the high-frequency semiconductor device 130 includes the high-frequency semiconductor device 104. The other configuration is same as that of the high-frequency semiconductor device 110.

Similarly to the high-frequency semiconductor device 100, the high-frequency semiconductor device 104 includes the input second-order harmonic matching circuit 19. Accordingly, similarly to the high-frequency semiconductor device 110, the high-frequency semiconductor device 130 can achieve both high power added efficiency and high gain.

In addition, the high-frequency semiconductor device 104 includes the third-order harmonic matching circuit 26, and thus each of impedance on the first capacitor 13 side as seen by the input electrode of the first unit transistor cell 7 and impedance on the first inductor side as seen by the input electrode of the second unit transistor cell 8 can be short-circuited at the frequency of the second-order harmonic and the frequency of the third-order harmonic. Accordingly, the high-frequency semiconductor device 130 can obtain higher power load added efficiency than that of the high-frequency semiconductor device 110.

When load impedance at the frequencies of the fundamental wave, the second-order harmonic, and the third-order harmonic is to be controlled in designing of an input matching circuit or an output matching circuit of a high-frequency semiconductor device, load optimization for one frequency typically affects a load at another frequency. Thus, when three frequencies are to be simultaneously optimized, a problem potentially occurs that, for example, the number of circuit elements increases and the size of the high-frequency semiconductor increases, or the optimization is insufficient or the frequency range of the optimization is narrow with a limited number of circuit elements.

As illustrated in FIG. 24, the second-order harmonic resonance circuit 19b and the third-order harmonic matching circuit 26 are connected in parallel. In addition, the input matching circuit 22 and the input second-order harmonic matching circuit 19 are connected in parallel as seen by the input electrodes of the unit transistor cells 7 and 8.

However, in the high-frequency semiconductor device 104, since the capacitor 15 and the inductor 16 resonate for the fundamental wave, any optional load connected to the connection point between the capacitor 15 and the inductor 16 does not affect impedance as seen by the input electrode of the first unit transistor cell 7 and the input electrode of the second unit transistor cell 8 for the fundamental wave. Thus, circuit optimization can be performed on the second-order harmonic resonance circuit 19b and the third-order harmonic matching circuit 26 without consideration on impedance for the fundamental wave. Circuit optimization can be also performed on the input matching circuit 22 without influence of the second-order harmonic resonance circuit 19b and the third-order harmonic matching circuit 26. Thus, circuit designing is easy in the third embodiment.

As described above, the high-frequency semiconductor device 104 according to the third embodiment includes: the semiconductor substrate 1; the first unit transistor cell 7 and the second unit transistor cell 8 provided adjacent to each other on the upper surface of the semiconductor substrate 1, each unit transistor cell being constituted by a plurality of multi-finger transistors having input electrodes connected in parallel and output electrodes connected in parallel; the first capacitor 13 provided on the upper surface of the semiconductor substrate 1 and having one end connected to the input electrode of the first unit transistor cell 7; the first inductor 14 provided on the upper surface of the semiconductor substrate 1 and having one end connected to the input electrode of the second unit transistor cell 8; the second capacitor 15 provided on the upper surface of the semiconductor substrate 1 and having one end connected to the other end of the first capacitor 13 and the other end of the first inductor 14; and the second inductor 16 provided on the upper surface of the semiconductor substrate 1, having one end connected to the other end of the second capacitor 15, and having the other end connected to the ground terminal, the first capacitor 13 and the first inductor 14 resonate at the frequency of the fundamental wave, and each of impedance on the first capacitor 13 side as seen by the input electrode of the first unit transistor cell 7 and impedance on the first inductor 14 side as seen by the input electrode of the second unit transistor cell 8 is short-circuited for the second-order harmonic.

The high-frequency semiconductor device 104 according to the third embodiment further includes the first bonding pad 11 provided on the upper surface of the semiconductor substrate 1 and connecting the one end of the first capacitor 13 and the input electrode of the first unit transistor cell 7; the second bonding pad 12 provided on the upper surface of the semiconductor substrate 1 and connecting the one end of the first inductor 14 and the input electrode of the second unit transistor cell 8; the output bonding pad 10 provided on the upper surface of the semiconductor substrate 1 and connected to the output electrodes of the first unit transistor cell 7 and the second unit transistor cell 8; and the third bonding pad 20 provided on the upper surface of the semiconductor substrate 1 and connected to the one end of the second capacitor 15.

The high-frequency semiconductor device 104 according to the third embodiment further includes the third-order harmonic matching circuit 26 that is provided on the upper surface of the semiconductor substrate 1 and connected to the other end of the first capacitor 13 and the other end of the first inductor 14 and to which a circuit constant is set so that each of impedance on the first capacitor 13 side as seen by the input electrode of the first unit transistor cell 7 and impedance on the first inductor 14 side as seen by the input electrode of the second unit transistor cell 8 is short-circuited at the frequency of the third-order harmonic.

The high-frequency semiconductor device 130 according to the third embodiment further includes: the input matching circuit 22 including the input terminal 21 to which a signal is input, and connected to the first bonding pad 11 and the second bonding pad 12; and the output matching circuit 23 including the output terminal 24 from which a signal is output, and connected to the output bonding pad 10.

As described above, since the high-frequency semiconductor device 104 includes the input second-order harmonic matching circuit 19 and the third-order harmonic matching circuit 26, each of impedance on the first capacitor 13 side as seen by the input electrode of the first unit transistor cell 7 and impedance on the first inductor side as seen by the input electrode of the second unit transistor cell 8 can be short-circuited at the frequency of the second-order harmonic and the frequency of the third-order harmonic. Accordingly, similarly to the high-frequency semiconductor device 100, the high-frequency semiconductor device 130 can achieve both high power added efficiency and high gain. In addition, the high-frequency semiconductor device 130 can obtain higher power added efficiency than that of the high-frequency semiconductor device 100.

Note that the high-frequency semiconductor device 130 may have a configuration in which the third-order harmonic matching circuit is not provided on the semiconductor substrate 1 but is provided outside the high-frequency semiconductor and connected to the third bonding pad.

Figure 25:
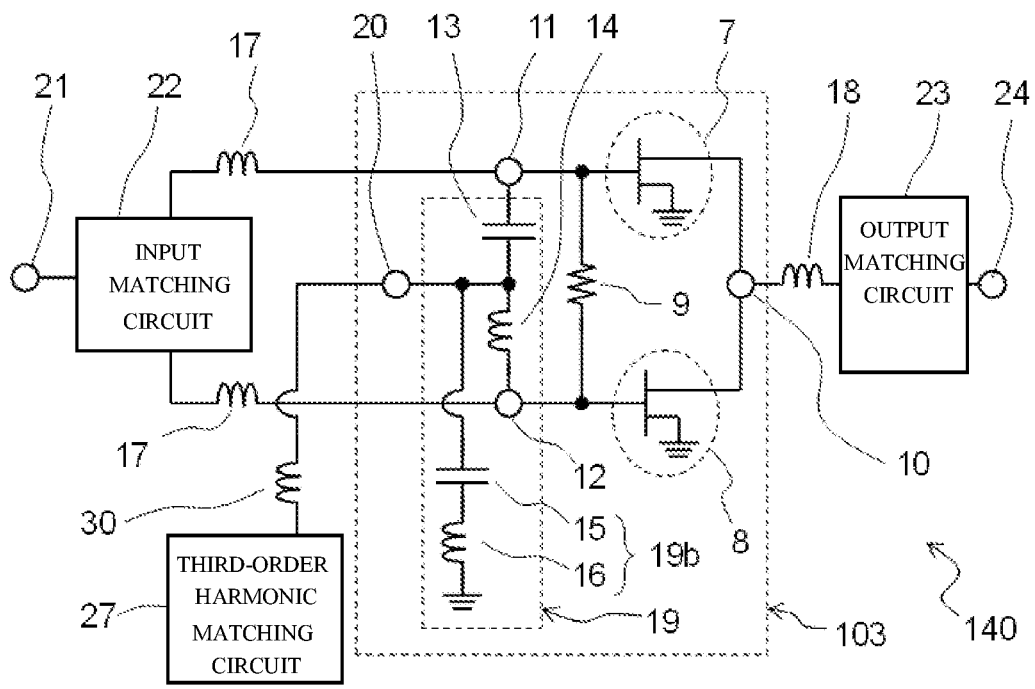
FIG. 25 is a diagram illustrating a high-frequency semiconductor device 140 as a modification of the third embodiment.

FIG. 25 is a diagram illustrating a high-frequency semiconductor device 140 as a modification of the third embodiment. For example, in the high-frequency semiconductor device 120 according to the second embodiment, the capacitor 31 that is short-circuited at the modulation frequency is connected to the bonding pad 20. However, in the high-frequency semiconductor device 140, one end of the bonding wire 30 as an inductor is connected to the bonding pad 20 as illustrated in FIG. 25. The other end of the bonding wire 30 is connected to a third-order harmonic matching circuit 27.

The high-frequency semiconductor device 140 can achieve effects same as those of the high-frequency semiconductor device 130 by appropriately designing the third-order harmonic matching circuit 27 with the inductance of the bonding wire 30 taken into account so that each of impedance on the first capacitor 13 side as seen by the input electrode of the first unit transistor cell 7 and impedance on the first inductor 14 side as seen by the input electrode of the second unit transistor cell 8 is short-circuited at the frequency of the third-order harmonic.

Note that connection through a bonding wire in the present disclosure may be replaceable with connection through a bump. The present disclosure may be subjected to any combination of the embodiments and change and omission of each embodiment as appropriate within the scope of the disclosure.

REFERENCE SIGNS LIST

1 semiconductor substrate, 2 gate electrode, 3 source electrode, 4 drain electrode, 5 via hole, 6, 9 gate feeder, 7, 7*a*~7*c*, 8, 8*a*~8*c* unit transistor cell, 10 output bonding pad, 11, 12, 20 bonding pad, 13, 15, 31 capacitor, 14, 16 inductor, 17, 18, 30 bonding wire, 19 input second-order harmonic matching circuit, 19*a* fundamental wave resonance circuit, 19*b* second-order harmonic resonance circuit, 21 input terminal, 22 input matching circuit, 23 output matching circuit, 24 output terminal, 26, 27 third-order harmonic matching circuit, 90 transistor, 100, 101, 102, 103,104, 110, 120, 130, 140 high-frequency semiconductor device

The invention claimed is:
1. A high-frequency semiconductor device comprising:
   a semiconductor substrate;
   a first unit transistor cell and a second unit transistor cell provided adjacent to each other on an upper surface of the semiconductor substrate, each unit transistor cell including a plurality of multi-finger transistors having input electrodes connected in parallel and output electrodes connected in parallel;
   a first capacitor provided on the upper surface of the semiconductor substrate and having one end connected to an input electrode of the first unit transistor cell;
   a first inductor provided on the upper surface of the semiconductor substrate and having one end connected to an input electrode of the second unit transistor cell;
   a second capacitor provided on the upper surface of the semiconductor substrate and having one end connected to another end of the first capacitor and another end of the first inductor; and
   a second inductor provided on the upper surface of the semiconductor substrate, having one end connected to another end of the second capacitor, and having another end connected to a ground terminal, wherein
   the first capacitor and the first inductor resonate at a frequency of a fundamental wave, and
   each of impedance on the first capacitor side as seen by the input electrode of the first unit transistor cell and impedance on the first inductor side as seen by the input electrode of the second unit transistor cell is short-circuited at a frequency of a second-order harmonic.

2. The high-frequency semiconductor device according to claim 1, further comprising a resistor connecting the input electrode of the first unit transistor cell and the input electrode of the second unit transistor cell.

3. The high-frequency semiconductor device according to claim 1, further comprising:
   a first bonding pad provided on the upper surface of the semiconductor substrate and connecting the one end of the first capacitor and the input electrode of the first unit transistor cell;
   a second bonding pad provided on the upper surface of the semiconductor substrate and connecting the one end of the first inductor and the input electrode of the second unit transistor cell; and
   an output bonding pad provided on the upper surface of the semiconductor substrate and connected to the output electrodes of the first and second unit transistor cells.

4. The high-frequency semiconductor device according to claim 3, further comprising a third bonding pad provided on the upper surface of the semiconductor substrate and connected to the one end of the second capacitor.

5. The high-frequency semiconductor device according to claim 3, further comprising:
   an input matching circuit including an input terminal to which a signal is input, and connected to the first bonding pad and the second bonding pad; and
   an output matching circuit including an output terminal from which a signal is output, and connected to the output bonding pad.

6. The high-frequency semiconductor device according to claim 5, further comprising:
   a third bonding pad provided on the upper surface of the semiconductor substrate and connected to the one end of the second capacitor;
   an inductor having one end connected to the third bonding pad; and
   a capacitor having one end connected to the other end of the inductor and having another end grounded, wherein
   the inductor has inductance that is opened at a frequency twice a carrier frequency of the signal input to the input terminal and that is short-circuited at a modulation frequency of the signal input to the input terminal, and
   the capacitor has capacitance that is short-circuited at the modulation frequency.

7. The high-frequency semiconductor device according to claim 5, further comprising a third-order harmonic matching circuit that is provided on the upper surface of the semiconductor substrate and connected to the other end of the first capacitor and the other end of the first inductor and to which a circuit constant is set so that each of impedance on the first capacitor side as seen by the input electrode of the first unit transistor cell and impedance on the first inductor side as seen by the input electrode of the second unit transistor cell is short-circuited at a frequency of a third-order harmonic.

8. The high-frequency semiconductor device according to claim 5, further comprising:
  a third bonding pad provided on the upper surface of the semiconductor substrate and connected to the one end of the second capacitor; and
  a third-order harmonic matching circuit that is connected to the third bonding pad through an inductor and to which a circuit constant is set so that each of impedance on the first capacitor side as seen by the input electrode of the first unit transistor cell and impedance on the first inductor side as seen by the input electrode of the second unit transistor cell is short-circuited at a frequency of a third-order harmonic.

9. The high-frequency semiconductor device according to claim 1, further comprising a third-order harmonic matching circuit that is provided on the upper surface of the semiconductor substrate and connected to the other end of the first capacitor and the other end of the first inductor and to which a circuit constant is set so that each of impedance on the first capacitor side as seen by the input electrode of the first unit transistor cell and impedance on the first inductor side as seen by the input electrode of the second unit transistor cell is short-circuited at a frequency of a third-order harmonic.

10. The high-frequency semiconductor device according to claim 9, further comprising:
  a first bonding pad provided on the upper surface of the semiconductor substrate and connecting the one end of the first capacitor and the input electrode of the first unit transistor cell;
  a second bonding pad provided on the upper surface of the semiconductor substrate and connecting the one end of the first inductor and the input electrode of the second unit transistor cell; and
  an output bonding pad provided on the upper surface of the semiconductor substrate and connected to the output electrodes of the first and second unit transistor cells.

11. The high-frequency semiconductor device according to claim 1, further comprising:
  an input matching circuit provided on the upper surface of the semiconductor substrate, including an input terminal to which a signal is input, and connected to the input electrodes of the first and second unit transistor cells; and
  an output matching circuit provided on the upper surface of the semiconductor substrate, including an output terminal from which a signal is output, and connected to the output electrodes of the first and second unit transistor cells.

* * * * *